(12) United States Patent
Uchida et al.

(10) Patent No.: US 9,380,393 B2
(45) Date of Patent: Jun. 28, 2016

(54) CAPACITANCE SENSOR, ACOUSTIC SENSOR, AND MICROPHONE

(71) Applicant: OMRON Corporation, Kyoto-shi, Kyoto (JP)

(72) Inventors: Yuki Uchida, Shiga (JP); Takashi Kasai, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/402,246

(22) PCT Filed: May 22, 2013

(86) PCT No.: PCT/JP2013/064288
§ 371 (c)(1),
(2) Date: Nov. 19, 2014

(87) PCT Pub. No.: WO2013/179990
PCT Pub. Date: Dec. 5, 2013

(65) Prior Publication Data
US 2015/0104048 A1    Apr. 16, 2015

(30) Foreign Application Priority Data

May 31, 2012   (JP) ................................ 2012-125527

(51) Int. Cl.
*H04R 25/00*      (2006.01)
*H04R 23/00*      (2006.01)
(Continued)

(52) U.S. Cl.
CPC ............... *H04R 23/00* (2013.01); *G01H 11/00* (2013.01); *G01R 27/2605* (2013.01); *H04R 7/06* (2013.01);
(Continued)

(58) Field of Classification Search
CPC ...... H04R 1/406; H04R 1/003; H04R 19/005; H04R 19/016; H04R 19/04; H04R 23/006; H04R 2201/003; B81B 2201/0257
USPC ......... 381/113, 116, 369, 173, 174, 175, 191, 381/181; 257/416
See application file for complete search history.

(56) References Cited

U.S. PATENT DOCUMENTS

2007/0047746 A1   3/2007   Weigold et al.
2008/0205668 A1   8/2008   Torii et al.
(Continued)

FOREIGN PATENT DOCUMENTS

JP   2008-245267 A   10/2008
JP      4924853 A     4/2012

OTHER PUBLICATIONS

Notice of Reason for Refusal for corresponding Japanese Application No. 2012-125527, mailed Sep. 6, 2014 (7 pages).
(Continued)

*Primary Examiner* — Sunita Joshi
(74) *Attorney, Agent, or Firm* — Osha Liang LLP

(57) ABSTRACT

A capacitance sensor has a substrate, a vibration electrode plate formed over an upper side of the substrate, a back plate formed over the upper side of the substrate to cover the vibration electrode plate, and a fixed electrode plate arranged on the back plate facing the vibration electrode plate. At least one of the vibration electrode plate and the fixed electrode plate is divided into a plurality of regions. A sensing unit configured by the vibration electrode plate and the fixed electrode plate is formed in each of the divided regions. The plurality of sensing units output a plurality of signals having different sensitivities. At least some sensing units of the sensing units have vibration electrode plates having areas different from the areas of the vibration electrode plates in the other sensing units.

11 Claims, 18 Drawing Sheets

(51) Int. Cl.
*H04R 19/00* (2006.01)
*H04R 7/06* (2006.01)
*G01H 11/00* (2006.01)
*G01R 27/26* (2006.01)
*H04R 3/00* (2006.01)
*H04R 1/28* (2006.01)
*H04R 19/04* (2006.01)

(52) U.S. Cl.
CPC ............... *H04R 19/005* (2013.01); *H04R 1/28* (2013.01); *H04R 19/04* (2013.01); *H04R 2201/003* (2013.01)

(56) References Cited

U.S. PATENT DOCUMENTS

2009/0316916 A1   12/2009  Haila et al.
2010/0183167 A1   7/2010   Phelps et al.
2012/0213400 A1*  8/2012   Kasai ..................... H04R 19/04
                                                          381/369

OTHER PUBLICATIONS

International Search Report for corresponding International Application No. PCT/JP2013/064288, mailed Jul. 9, 2013 (1 page).

\* cited by examiner (A)

(B)

CAPACITANCE SENSOR, ACOUSTIC SENSOR, AND MICROPHONE

BACKGROUND

1. Technical Field

The present invention relates to a capacitance sensor, an acoustic sensor, and a microphone. More specifically, the present invention relates to a capacitance sensor configured by a capacitor structure including a vibration electrode plate (diaphragm) and a fixed electrode plate. The present invention also relates to an acoustic sensor (acoustic transducer) that converts acoustic vibration into an electric signal to output the electric signal and a microphone using the acoustic sensor. In particular, the present invention relates to a minute-sized capacitance sensor and a minute-sized acoustic sensor that are manufactured by using an MEMS (Micro Electro Mechanical System) technique.

2. Related Art

As a small-sized microphone mounted on a mobile phone or the like, an electret condenser microphone (Electret Condenser Microphone) has been popularly used. However, the electret condenser microphone is weak against heat, and is inferior to a MEMS microphone in corresponding to digitalization, reduction in size, high-functionalization/multi-functionalization, and power saving. For this reason, at present, the MEMS microphone has been popularized.

The MEMS microphone includes an acoustic sensor (acoustic transducer) that detects acoustic vibration and converts the acoustic vibration into an electric signal (detection signal), a drive circuit that applies a voltage to the acoustic sensor, and a signal processing circuit that performs signal processing such as amplification to the detection signal from the acoustic sensor to output the resultant signal to the outside. The acoustic sensor used in the MEMS microphone is a capacitance acoustic sensor manufactured by using the MEMS technique. The drive circuit and the signal processing circuit are integrally manufactured as an ASIC (Application Specific Integrated Circuit) by using a semiconductor manufacturing technique.

In recent years, a microphone is required to high-sensitively detect sound having sound pressures ranging from a low sound pressure to a high sound pressure. In general, the maximum input sound pressure of a microphone is limited by a total harmonic distortion (Total Harmonic Distortion). This is because, when sound having a high sound pressure is to be detected with a microphone, harmonic distortion occurs in an output signal to damage sound quality and accuracy. Thus, when the total harmonic distortion can be reduced to a low level, the maximum input sound pressure is increased to make it possible to widen a detection sound pressure range (hereinafter, to be referred to as a dynamic range) of the microphone.

However, in a general microphone, trade-off between improvement of detection sensitivity of acoustic vibration and a reduction in total harmonic distortion is established. For this reason, in a high-sensitive microphone that can detect a small volume (low sound pressure), a total harmonic distortion of an output signal increases when the microphone receives sound having a large volume, and, therefore, the maximum detection sound pressure is limited. This is because the high-sensitive microphone outputs a greater signal and easily causes harmonic distortion. In contrast to this, when the harmonic distortion of the output signal is reduced to increase the maximum detection sound pressure, the sensitivity of the microphone is deteriorated to make it difficult to detect sound having a small volume with high quality. As a result, in a general microphone is difficult to have a wide dynamic range from a small sound volume (low sound pressure) to a large sound volume (high sound pressure).

In the technical background, as a method of achieving a microphone having a wide dynamic range, a microphone using a plurality of acoustic sensors having different detection sensitivities is examined. As such a microphone, for example, a microphone disclosed in Patent Documents 1 to 4 is known.

Patent Documents 1 and 2 disclose a microphone in which a plurality of acoustic sensors are arranged and a plurality of signals from the plurality of acoustic sensors are switched or merged with each other depending on sound pressures. In the microphone, for example, a high-sensitive acoustic sensor that can detect a sound pressure level (SPL) of about 30 dB to 115 dB and a low-sensitive acoustic sensor that can detect a sound pressure level of about 60 dB to 140 dB are switched and used to make it possible to configure a microphone that can detect a sound pressure level of about 30 dB to 140 dB. Patent Documents 3 and 4 disclose one chip on which a plurality of independent acoustic sensors are formed.

FIG. 1A shows a relationship between a total harmonic distortion and a sound pressure in a high-sensitive acoustic sensor in Patent Document 1. FIG. 1B shows a relationship between a total harmonic distortion and a sound pressure in a low-sensitive acoustic sensor in Patent Document 1. FIG. 2 shows relationships between average displacement amounts and sound pressures of diaphragms in the high-sensitive acoustic sensor and the low-sensitive acoustic sensor in Patent Document 1. When it is assumed that an allowable total harmonic distortion is 20%, the maximum detection sound pressure of the high-sensitive acoustic sensor is about 115 dB. In the high-sensitive acoustic sensor, since an S/N ratio deteriorates when the sound pressure is smaller than about 30 dB, the minimum detection sound pressure is about 30 dB. Thus, the dynamic range of the high-sensitive acoustic sensor is, as shown in FIG. 1A, about 30 dB to 115 dB. Similarly, when it is assumed that an allowable total harmonic distortion is 20%, the maximum detection sound pressure of the low-sensitive acoustic sensor is about 140 dB. The low-sensitive acoustic sensor has a diaphragm area smaller than that of the high-sensitive acoustic sensor, and, as shown in FIG. 2, an average displacement amount of the diaphragm smaller than that of the high-sensitive acoustic sensor. Thus, the minimum detection sound pressure of the low-sensitive acoustic sensor is larger than the high-sensitive acoustic sensor, i.e., about 60 dB. As a result, the dynamic range of the low-sensitive acoustic sensor is, as shown in FIG. 1B, about 60 dB to 140 dB. When the high-sensitive acoustic sensor and the low-sensitive acoustic sensor as described above are combined with each other, a detectable sound pressure range, as shown in FIG. 1C, becomes wide, i.e., about 30 dB to 140 dB.

Patent Document 1: Publication of US patent application No. 2009/0316916

Patent Document 2: Publication of US patent application No. 2010/0183167

Patent Document 3: Japanese Unexamined Patent Publication No. 2008-245267

Patent document 4: Publication of US patent application No. 2007/0047746

SUMMARY

However, in a microphone described in Patent Documents 1 to 4, even though a plurality of acoustic sensors are formed on different chips, respectively, or a plurality of acoustic sensors are integrally formed on one chip (substrate), the acoustic sensors have independent capacitor structures, respectively. For this reason, in such a microphone, a fluctuation of acoustic characteristics and mismatching of acoustic characteristics occur. Hereinafter, the fluctuation of acoustic characteristics means a difference between acoustic characteristics of acoustic sensors in different chips. The mismatching of acoustic characteristics means a difference between acoustic characteristics of a plurality of acoustic sensors in the same chip.

More specifically, when the acoustic sensors are formed on different chips, due to fluctuations in warpage and thickness of diaphragms to be manufactured, a fluctuation in detection sensitivity between the chips occurs. As a result, the fluctuation of the chips related to a difference between the detection sensitivities of the acoustic sensors increases. Even though independent acoustic sensors are integrally formed on one common chip, in manufacturing of capacitor structures of the acoustic sensors by using the MEMS technique, gap distances between diaphragms and fixed electrodes easily fluctuate. Furthermore, a back chamber and a vent hole are independently formed as a result, mismatching in a chip occurs in acoustic characteristics such as frequency characteristics and phases influenced by the back chamber and the vent hole.

One or more embodiments of the present invention provides a capacitance sensor and an acoustic sensor in each of which a plurality of sensing units having different sensitivities are integrally formed to achieve a wide dynamic range, small mismatching between the sensing units, and high impact resistance.

According to one or more embodiments of the present invention, there is provided a first capacitance sensor including: a vibration electrode plate formed over an upper side of a substrate; a back plate formed over the upper side of the substrate to cover the vibration electrode plate; and a fixed electrode plate arranged on the back plate to face the vibration electrode plate, in which at least one of the vibration electrode plate and the fixed electrode plate is divided into a plurality of regions, a sensing unit configured by the vibration electrode plate and the fixed electrode plate is formed in each of the divided regions, the plurality of sensing units output a plurality of signals having different sensitivities, at least some sensing units of the sensing units have vibration electrode plates having areas different from the areas of the vibration electrode plates in the other sensing units, and, of the sensing units, some sensing units having the vibration electrode plates having small areas have back plates in the regions of the corresponding sensing units having rigidity higher than rigidity of the back plates in the other sensing units having the vibration electrode plates having large areas.

According to the first capacitance sensor according to one or more embodiments of the present invention, since at least one of the vibration electrode plate and the fixed electrode plate is divided, a plurality of sensing units (variable capacitor structures) are formed between the vibration electrode plate and the fixed electrode plate. Thus, each of the divided sensing units can output an electric signal, and a change in pressure such as acoustic vibration can be converted into a plurality of electric signals and output. According to the capacitance sensor, for example, the areas of the vibration electrode plates of each of the sensing units are made different from each other to make it possible to make detection ranges or sensitivities of the sensing units different from each other, and the signals are switched and combined with each other to make it possible to widen a detection range of the capacitance sensor without deteriorating the sensitivity.

Since the plurality of sensing units can be formed by dividing the vibration electrode plate or the fixed electrode plate, in comparison with a conventional art having a plurality of sensing units that are separately manufactured and independent of each other, a fluctuation of characteristics between the sensing units decreases. As a result, a fluctuation of characteristics caused by a difference between the detection sensitivities of the sensing units can be reduced. Since the sensing units share the vibration electrode plate and the fixed electrode plate, mismatching related to characteristics such as frequency characteristics and phases can be suppressed.

Furthermore, in the first capacitance sensor, the areas of the vibration electrode plates of some sensing units are made different from the areas of the vibration electrode plates of the other sensing units. When dropping impact acts on the capacitance sensor to deform the vibration electrode plate so as to cause the vibration electrode plate to collide with the back plate, the back plate is deformed by the impact of the vibration electrode plate when the back plate has low rigidity, and the back plate cannot catch the vibration electrode plate. For this reason, the vibration electrode plate may be largely deformed to damage the vibration electrode plate. At this time, when the vibration electrode plates are displaced by the same displacement amount, a vibration electrode plate having a smaller area when viewed from a direction perpendicular to the upper surface of the substrate has larger local deformation (bending deformation). However, in the capacitance sensor according to one or more embodiments of the present invention, when the rigidity of the back plate is increased in the region of the vibration electrode plate having a small area, since the back plate is not easily deformed when the vibration electrode plate having a small area is deformed by dropping impact or the like to collide with the back plate, the vibration electrode plate having a small area is not deformed any more. As a result, the vibration electrode plate can be more effectively prevented from being damaged.

The case in which the areas of the vibration electrode plates in some sensing units are different from the areas of the vibration electrode plates in the other sensing units is a case in which, for example, when two sensing units are present, areas of the two sensing units when viewed from a direction perpendicular to the upper surface of the substrate are different from each other. The case is a case in which, when three or more sensing units are present, typically, the areas of the three sensing units when viewed from the direction perpendicular to the upper surface of the substrate are different from each other. When the three or more sensing units are present, an area when viewed from the direction perpendicular to the upper surface of the substrate may include the same sensing units.

According to one or more embodiments of the present invention, there is provided a second capacitance sensor including: a vibration electrode plate formed over an upper side of a substrate; a back plate formed over the upper side of the substrate to cover the vibration electrode plate; and a fixed electrode plate arranged on the back plate to face the vibration electrode plate, in which at least one of the vibration electrode plate and the fixed electrode plate is divided into a plurality of regions, a sensing unit configured by the vibration electrode plate and the fixed electrode plate is formed in each of the divided regions, the plurality of sensing units output a plurality of signals having different sensitivities, each of the sensing units has a plurality of openings in the back plate and the fixed electrode plate, at least some sensing units of the sensing units have vibration electrode plates having areas different from the areas of the vibration electrode plates in the other sensing units, and, of the sensing units, at least one pair of sensing units having the vibration electrode plates having different areas are configured such that an aperture ratio of the opening in the sensing unit having the vibration electrode plate having a small area is smaller than an aperture ratio of the opening in the sensing unit having the vibration electrode plate having a large area. In this case, as a method of adjusting the aperture ratio of the back plate, a method of adjusting a hole diameter (opening area) of each of the openings, a method of adjusting a distribution density (number density) of each of the openings, and a method of adjusting a hole diameter and a distribution density of each of the openings are given.

According to the second capacitance sensor according to one or more embodiments of the present invention, since at least one of the vibration electrode plate and the fixed electrode plate is divided, a plurality of sensing units (variable capacitor structures) are formed between the vibration electrode plate and the fixed electrode plate. Thus, each of the divided sensing units can output an electric signal, and a change in pressure such as acoustic vibration can be converted into a plurality of electric signals and output. According to the capacitance sensor, for example, the areas of the vibration electrode plates of each of the sensing units are made different from each other to make it possible to make detection ranges or sensitivities of the sensing units different from each other, and the signals are switched and combined with each other to make it possible to widen a detection range of the capacitance sensor without deteriorating the sensitivity.

Since the plurality of sensing units can be formed by dividing the vibration electrode plate or the fixed electrode plate that are simultaneously manufactured, in comparison with a conventional art having a plurality of sensing units that are separately manufactured and independent of each other, a fluctuation of characteristics between the sensing units decreases. As a result, a fluctuation of characteristics caused by a difference between the detection sensitivities of the sensing units can be reduced. Since the sensing units share the vibration electrode plate and the fixed electrode plate, mismatching related to characteristics such as frequency characteristics and phases can be suppressed.

Furthermore, in the second capacitance sensor, the areas of the vibration electrode plates of some sensing units are different from the areas of the vibration electrode plates of the other sensing units, the aperture ratio of the back plate in the sensing unit having the vibration electrode plate having a small area is smaller than the aperture ratio of the back plate in the sensing unit having the vibration electrode plate having a large area, and the rigidity of the back plate in the sensing unit having the vibration electrode plate having a small area is improved. When dropping impact acts on the capacitance sensor to deform the vibration electrode plate so as to cause the vibration electrode plate to collide with the back plate, the back plate is deformed by the impact of the vibration electrode plate when the back plate in the sensing unit having the vibration electrode plate having a small area has low rigidity, and the back plate cannot catch the vibration electrode plate. For this reason, the vibration electrode plate having a small area may be largely deformed to damage the vibration electrode plate. However, in the second capacitance sensor according to one or more embodiments of the present invention, since the rigidity of the back plate in the sensing unit having the vibration electrode plate having a small area is increased, the back plate is not easily deformed when the vibration electrode plate is deformed by dropping impact or the like to cause the vibration electrode plate to collide with the back plate, so that the vibration electrode plate is not deformed any more. As a result, the vibration electrode plate in the sensing unit having the vibration electrode plate having a small area can be more effectively prevented from being damaged.

In the second capacitance sensor, for example, when two sensing units are present, the areas of the vibration electrode plates in the two sensing units are different from each other, the aperture ratio of the back plate in the sensing unit having the vibration electrode plate having a small area is relatively small, and the aperture ratio of the back plate in the sensing unit having the vibration electrode plate having a large area is relatively large. When three or more sensing units are present, typically, the aperture ratios of the three sensing units are different from each other, and the sensing unit having the vibration electrode plate having a smaller area has a back plate having a smaller aperture ratio. When the three or more sensing units are present, the sensing units may include sensing units having vibration electrode plates having equal areas.

According to a second capacitance sensor according to one or more embodiments of the present invention, there is provided a second capacitance sensor in which an aperture ratio of a back plate is adjusted by a hole diameter of an opening formed in the back plate, at least one of the vibration electrode plate and the fixed electrode plate is divided into two regions in which the two sensing units are formed, and the hole diameter of the opening in the sensing unit having the vibration electrode plate having a small area is ½ or less the hole diameter of the opening in the sensing unit having the vibration electrode plate having a large area. According to one or more embodiments of the present invention, the vibration electrode plate in the sensing unit having the vibration electrode plate having a small area can be effectively prevented from being damaged.

The hole diameter of the opening in the sensing unit having the vibration electrode plate having a small area is desirably 10 µm or less. Even though an opening is formed in the fixed electrode plate to communicate with the opening of the back plate, since an electric field between the fixed electrode plate and the vibration electrode plate spreads in the opening, the sensing unit can be regarded as a capacitor having a fixed electrode plate being free from a hole, and the sensitivity of the capacitance sensor is improved. This is called a fringe effect. However, the fringe effect cannot be expected when the hole diameter of the opening is larger than 10 µm or more. The hole diameter of the opening in the back plate in the sensing unit having the vibration electrode plate having a small area is desirably 10 µm or less.

According to a second capacitance sensor according to one or more embodiments of the present invention, there is provided a second capacitance sensor in which an aperture ratio of a back plate is adjusted by a distribution density of openings formed in the back plate, at least one of the vibration electrode plate and the fixed electrode plate is divided into two regions in which the two sensing units are formed, an alignment pitch of the openings in the sensing unit having the vibration electrode plate having a small area is twice or more an alignment pitch of the openings in the sensing unit having the vibration electrode plate having a large area. In a capacitance sensor in which at least one of a vibration electrode plate and a fixed electrode plate is divided into two regions in which two sensing units are formed, when an alignment pitch of openings is increased to increase rigidity of a back plate, in order to effectively prevent the vibration electrode plate from being damaged, an alignment pitch of openings formed in the back plate on the side on which the area of the vibration electrode plate is large is desirably twice or more an alignment pitch of openings formed in the back plate on the side on which the area of the vibration electrode plate is small.

According to one or more embodiments of the present invention, there is provided a third capacitance sensor including: a vibration electrode plate formed over an upper side of a substrate; a back plate formed over the upper side of the substrate to cover the vibration electrode plate; and a fixed electrode plate arranged on the back plate to face the vibration electrode plate, in which at least one of the vibration electrode plate and the fixed electrode plate is divided into a plurality of regions, a sensing unit configured by the vibration electrode plate and the fixed electrode plate is formed in each of the divided regions, the plurality of sensing units output a plurality of signals having different sensitivities, at least some sensing units of the sensing units have vibration electrode plates having areas different from the areas of the vibration electrode plates in the other sensing units, and, of the sensing units, at least one pair of sensing units having the vibration electrode plates having different areas are configured such that a thickness of the back plate in the sensing unit having the vibration electrode plate having a small area is larger than a thickness of the back plate in the sensing unit having the vibration electrode plate having a large area.

According to the third capacitance sensor according to one or more embodiments of the present invention, since at least one of the vibration electrode plate and the fixed electrode plate is divided, a plurality of sensing units (variable capacitor structures) are formed between the vibration electrode plate and the fixed electrode plate. Thus, each of the divided sensing units can output an electric signal, and a change in pressure such as acoustic vibration can be converted into a plurality of electric signals and output. According to the capacitance sensor, for example, the areas of the vibration electrode plates of each of the sensing units are made different from each other to make it possible to make detection ranges or sensitivities of the sensing units different from each other, and the signals are switched and combined with each other to make it possible to widen a detection range of the capacitance sensor without deteriorating the sensitivity.

Since the plurality of sensing units can be formed by dividing the vibration electrode plate or the fixed electrode plate that are simultaneously manufactured, in comparison with a conventional art having a plurality of sensing units that are separately manufactured and independent of each other, a fluctuation of characteristics between the sensing units decreases. As a result, a fluctuation of characteristics caused by a difference between the detection sensitivities of the sensing units can be reduced. Since the sensing units share the vibration electrode plate and the fixed electrode plate, mismatching related to characteristics such as frequency characteristics and phases can be suppressed.

Furthermore, in the third capacitance sensor, the areas of the vibration electrode plates of some sensing units are different from the areas of the vibration electrode plates of the other sensing units, the thickness of the back plate in the sensing unit having the vibration electrode plate having a small area is larger than the thickness of the back plate in the sensing unit having the vibration electrode plate having a large area, and the rigidity of the back plate in the sensing unit having the vibration electrode plate having a small area is improved. When dropping impact acts on the capacitance sensor to deform the vibration electrode plate so as to cause the vibration electrode plate to collide with the back plate, the back plate is deformed by the impact of the vibration electrode plate when the back plate in the sensing unit having the vibration electrode plate having a small area has low rigidity, and the back plate cannot catch the vibration electrode plate. For this reason, the vibration electrode plate may be largely deformed to damage the vibration electrode plate having a small area. However, in the third capacitance sensor according to one or more embodiments of the present invention, since the rigidity of the back plate in the sensing unit having the vibration electrode plate having a small area is increased, the back plate is not easily deformed when the vibration electrode plate is deformed by dropping impact or the like to cause the vibration electrode plate to collide with the back plate, so that the vibration electrode plate is not deformed any more. As a result, the vibration electrode plate in the sensing unit having the vibration electrode plate having a small area can be more effectively prevented from being damaged.

In the third capacitance sensor, for example, when two sensing units are present, the areas of the vibration electrode plates in the two sensing units are different from each other, the thickness of the back plate in the sensing unit having the vibration electrode plate having a small area is relatively large, and the thickness of the back plate in the sensing unit having the vibration electrode plate having a large area is relatively small. When three or more sensing units are present, typically, the thicknesses of the back plate in the three sensing units are different from each other, the sensing unit having the vibration electrode plate having a smaller area has a back plate having a larger thickness. When the three or more sensing units are present, the sensing units may include sensing units having vibration electrode plates having equal areas.

According to the first and second capacitance sensors according to one or more embodiments of the present invention and the third capacitance sensor according to one or more embodiments of the present invention, the vibration electrode plate is divided into a plurality of regions, and a sensing unit configured by the vibration electrode plate and the fixed electrode plate is formed in each of the divided regions. In one or more of the embodiments, since a vibration electrode displaced with a pressure is divided to form a plurality of sensing units, the independence of each of the sensing units is improved.

An acoustic sensor according to one or more embodiments of the present invention is an acoustic sensor using the first, second, or third capacitance sensor in which a plurality of openings to cause acoustic vibration to pass are formed in the back plate and the fixed electrode plate, and the sensing unit outputs a signal by a change in capacitance between the diaphragm and the fixed electrode plate that respond to the acoustic vibration. According to the acoustic sensor, a high-sensitive high-quality acoustic sensor having a wide dynamic range from a small volume (low sound pressure) to a large volume (high sound pressure) can be manufactured. In addition, the rigidity of the back plate in the sensing unit for a large volume is increased to prevent the vibration electrode plate in the sensing unit for a large volume from being damaged when the acoustic sensor is dropped, and the impact resistance and durability of the acoustic sensor can be improved.

The microphone according to one or more embodiments of the present invention includes the acoustic sensor according to one or more embodiments of the present invention, and a circuit unit that amplifies a signal from the acoustic sensor to output the amplified signal to the outside. The microphone has the same operational effect as that of the acoustic sensor.

DETAILED DESCRIPTION

Embodiments of the present invention will be described below with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. The present invention is not limited to the following embodiments, and can be variously changed in design without departing from the spirit and scope of the invention. In particular, the acoustic sensor and the microphone will be exemplified below. However, one or more embodiments of the present invention can be applied to not only the acoustic sensor but also a capacitance sensor such as a pressure sensor.

First Embodiment

Figure 3:
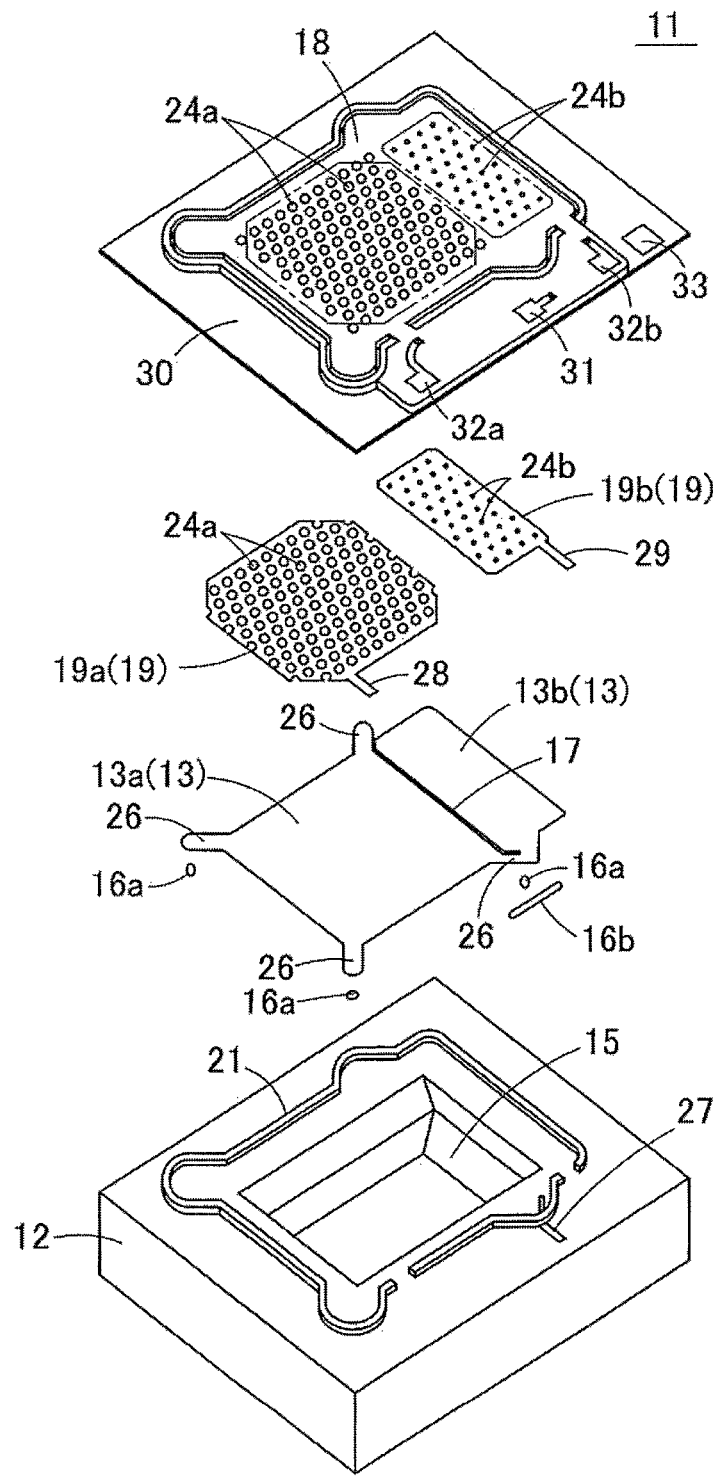
FIG. 3 is an exploded perspective view of an acoustic sensor according to a first embodiment of the present invention.
Figure 4:
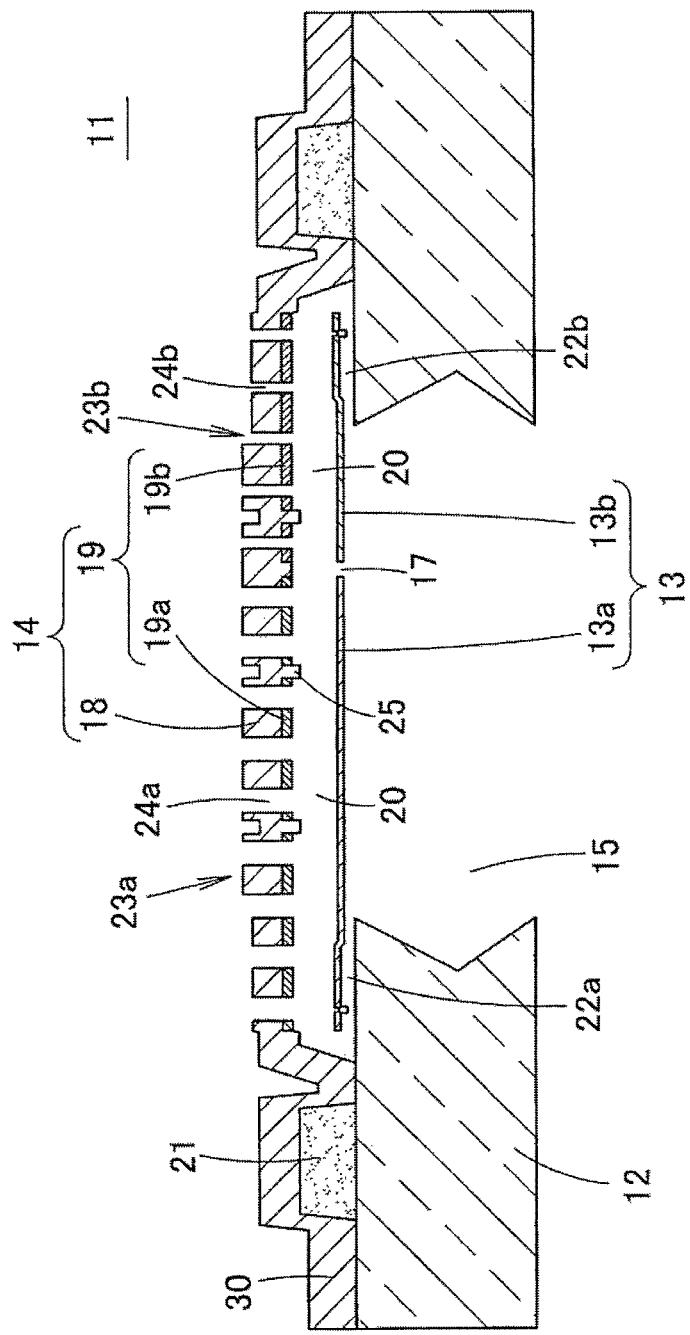
FIG. 4 is a sectional view of the acoustic sensor according to the first embodiment of the present invention.
Figure 5:
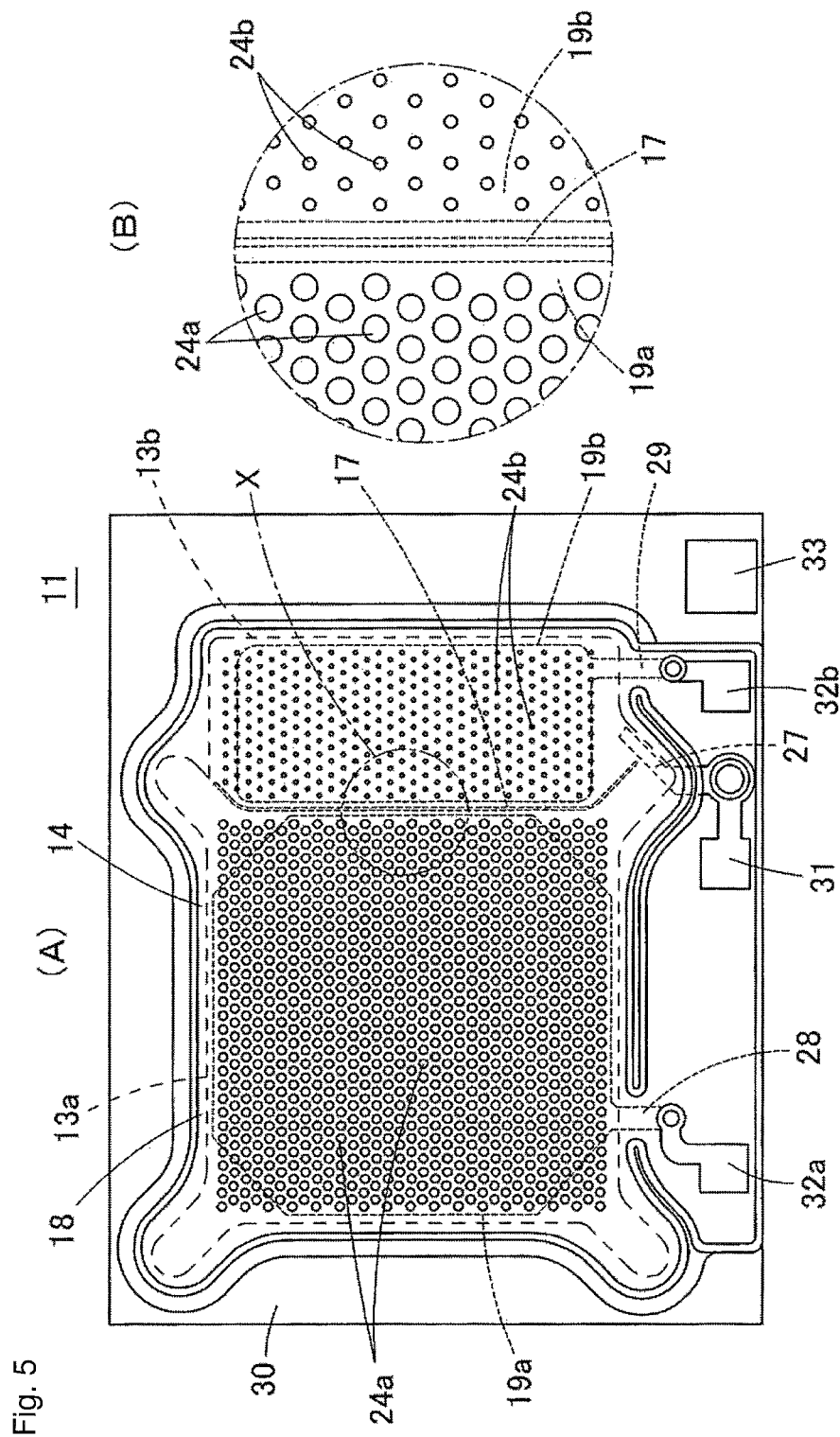
FIG. 5A is a plan view of the acoustic sensor according to the first embodiment of the present invention.
FIG. 5B is an enlarged view of an X portion in FIG. 5A.
Figure 6:
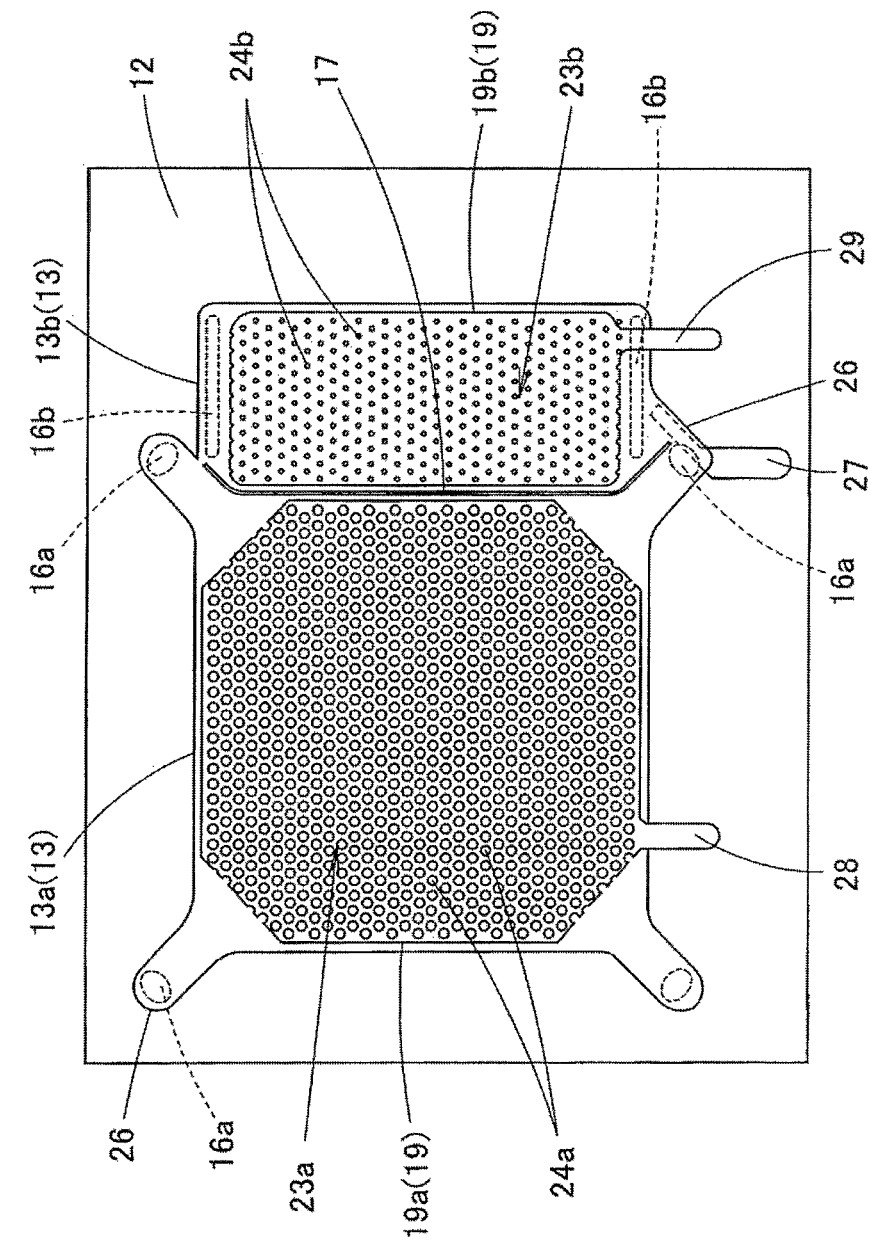
FIG. 6 is a plan view showing a state in which a back plate, a protecting film, and the like are removed from the acoustic sensor shown in FIG. 5A.

A structure of an acoustic sensor according to a first embodiment of the present invention will be described below with reference to FIGS. 3 to 6. FIG. 3 is an exploded perspective view of an acoustic sensor 11 according to the first embodiment of the present invention. FIG. 4 is a sectional view of the acoustic sensor 11. FIG. 5A is a plan view of the acoustic sensor 11. FIG. 5B is an enlarged view of an X portion in FIG. 5A. FIG. 6 is a plan view of the acoustic sensor 11 from which a back plate 18, a protecting film 30, and the like are removed, and shows a manner in which a diaphragm 13 and a fixed electrode plate 19 overlap above a silicon substrate 12. These drawings do not reflect manufacturing steps of the acoustic sensor 11 by MEMS.

The acoustic sensor 11 is a capacitance element manufactured by using a MEMS technique. As shown in FIGS. 3 and 4, in the acoustic sensor 11, a diaphragm 13 is formed on the upper surface of the silicon substrate 12 (substrate) through anchors 16a and 16b, a lid unit 14 is arranged above the diaphragm 13 through a very small air gap 20 (void), and the lid unit 14 is fixed to the upper surface of the silicon substrate 12.

In the silicon substrate 12 made of single-crystalline silicon, a chamber 15 (cavity portion) is formed to penetrate the silicon substrate 12 from the upper surface to the rear surface. Although the illustrated chamber 15 has wall surfaces configured by inclined surfaces formed by a (111) plane of a (100) plane silicon substrate and a plane equivalent to the (111) plane, the wall surfaces of the chamber 15 may be vertical surfaces.

The diaphragm 13 is arranged above the silicon substrate 12 to cover the upper side of the chamber 15. As shown in FIG. 3 and FIG. 6, the diaphragm 13 is formed to have a nearly rectangular shape. The diaphragm 13 is formed by a polysilicon thin film having conductivity, and the diaphragm 13 itself serves as a vibration electrode plate. The diaphragm 13 is divided into two small and large regions by a nearly straight slit 17 extending in a direction parallel to the short side. However, the diaphragm 13 is not completely divided by two by the slit 17, and are mechanically and electrically connected to each other near an end of the slit 17. Hereinafter, of the two regions divided by the slit 17, a nearly rectangular region having a large area is called a first diaphragm 13a, and a nearly rectangular region having an area smaller than that of the first diaphragm 13a is called a second diaphragm 13b.

The first diaphragm 13a is supported on the upper surface of the silicon substrate 12 such that leg pieces 26 arranged at the corners of the first diaphragm 13a are supported by anchors 16a and the first diaphragm 13a is floated from the upper surface of the silicon substrate 12. As shown in FIG. 4, between the adjacent anchors 16a, a narrow vent hole 22a to cause acoustic vibration to pass is formed between a lower surface of an outer peripheral portion of the first diaphragm 13a and the upper surface of the silicon substrate 12.

The second diaphragm 13b is supported on the upper surface of the silicon substrate 12 such that both the short sides are supported by anchors 16b and the second diaphragm 13b is floated from the upper surface of the silicon substrate 12. Between a lower surface of a long side of the second diaphragm 13b and the upper surface of the silicon substrate 12, a narrow vent hole 22b to cause acoustic vibration to pass is formed.

Both the first diaphragm 13a and the second diaphragm 13b are located at equal levels from the upper surface of the silicon substrate 12. More specifically, the vent hole 22a and the vent hole 22b serve as spaces having equal heights. A drawing wire 27 arranged on the upper surface of the silicon substrate 12 is connected to the diaphragm 13. Furthermore, on the upper surface of the silicon substrate 12, a band-like base portion 21 is formed to surround the diaphragm 13. The anchors 16a and 16b and the base portion 21 are made of $SiO_2$.

As shown in FIG. 4, the lid unit 14 is formed such that the fixed electrode plate 19 made of polysilicon is arranged on the lower surface of the back plate 18 made of SiN. The lid unit 14 is formed in the form of a dome and has a cavity portion thereunder, and the cavity portion covers the diaphragms 13a and 13b. The very small air gap 20 (cavity) is formed between the lower surface (i.e., the lower surface of the fixed electrode plate 19) of the lid unit 14 and the upper surfaces of the diaphragms 13a and 13b.

The fixed electrode plate 19 is divided into a first fixed electrode plate 19a facing the first diaphragm 13a and a second fixed electrode plate 19b facing the second diaphragm 13b, and the fixed electrode plates 19a and 19b are electrically separated from each other. The first fixed electrode plate 19a has an area larger than that of the second fixed electrode plate 19b. A drawing wire 28 is drawn from the first fixed electrode plate 19a, and a drawing wire 29 is drawn from the second fixed electrode plate 19b.

The first diaphragm 13a and the first fixed electrode plate 19a facing each other through the air gap 20 form a first acoustic sensing unit 23a having a capacitor structure. The second diaphragm 13b and the second fixed electrode plate 19b facing each other through the air gap 20 form a second acoustic sensing unit 23b having a capacitor structure. A gap distance of the air gap 20 in the first acoustic sensing unit 23a is equal to a gap distance of the air gap 20 in the second acoustic sensing unit 23b. A division position between the first and second diaphragms 13a and 13b and a division position between the first and second fixed electrode plates 19a and 19b are matched with each other in the illustrated example. However, the division positions may be different from each other.

In the first acoustic sensing unit 23a, in the lid unit 14 (La, the back plate 18 and the first fixed electrode plate 19a), a large number of acoustic holes 24a (acoustic holes) to cause acoustic vibration to pass are formed to penetrate the lid unit 14 from the upper surface to the lower surface. In the second acoustic sensing unit 23b, in the lid unit 14 (i.e., the back plate 18 and the second fixed electrode plate 19b), a large number of acoustic holes 24b (acoustic holes) to cause acoustic vibration to pass are formed to penetrate the lid unit 14 from the upper surface to the lower surface.

As shown in FIG. 5 and FIG. 6, the acoustic holes 24a and 24b are regularly arrayed. In the illustrated example, the acoustic holes 24a and 24b are arrayed in the form of a triangle along three directions forming angles of 120°. However, the acoustic holes 24a and 24b may be arranged in the form of a rectangle, a concentric circle, or the like. Although the acoustic holes 24a and 24b are arranged at the same pitch or the same distribution density (number density), the opening area of each of the acoustic holes 24a of the first acoustic sensing unit 23a is larger than the opening area of each of the acoustic holes 24b of the second acoustic sensing unit 23b. Thus, the rigidity of the back plate 18 in the second acoustic sensing unit 23b is higher than that in the first acoustic sensing unit 23a.

As shown in FIG. 4, even in the first acoustic sensing unit 23a and the second acoustic sensing unit 23b, very small stoppers 25 (projections) each having a columnar shape project from the lower surface of the lid unit 14. The stoppers 25 integrally project from the lower surface of the back plate 18, penetrate the first and second fixed electrode plates 19a and 19b, and project from the lower surface of the lid unit 14. Since the stoppers 25 are made of SiN like the back plate 18, the stoppers 25 have insulativity. The stoppers 25 are used to prevent the diaphragms 13a and 13b from being fixed to and adhering to the fixed electrode plates 19a and 19b by electrostatic force.

The protecting film 30 continuously extends from the whole outer edge of the back plate 18 having a lid-like shape. The protecting film 30 covers the base portion 21 and a silicon substrate surface outside the base portion 21.

On the upper surface of the protecting film 30, a common electrode pad 31, a first electrode pad 32a, a second electrode pad 32b, and a ground electrode pad 33 are arranged. The other end of the drawing wire 27 connected to the diaphragm 13 is connected to the common electrode pad 31. The drawing wire 28 drawn from the first fixed electrode plate 19a is connected to the first electrode pad 32a, and the drawing wire 29 drawn from the second fixed electrode plate 19b is connected to the second electrode pad 32b. The electrode pad 33 is connected to the silicon substrate 12 and is kept at a ground potential.

In the acoustic sensor 11, when acoustic vibration enters the chamber 15 (front chamber), the diaphragms 13a and 13b that are thin films vibrate in the same phase with the acoustic vibration. When the diaphragms 13a and 13b vibrate, the capacitances of the acoustic sensing units 23a and 23b change. As a result, in the acoustic sensing units 23a and 23b, acoustic vibration (change in sound pressure) sensed by the diaphragms 13a and 13b becomes a change in capacitance between the diaphragms 13a and 13b and the fixed electrode plates 19a and 19b, and the change in the capacitance is output as an electric signal. In a different using mode, more specifically, in a using mode in which the chamber 15 is used as a back chamber, acoustic vibration passes through the acoustic holes 24a and 24b and enters the air gap 20 in the lid unit 14 to vibrate the diaphragms 13a and 13b as a thin film.

Since the area of the second diaphragm 13b is smaller than the area of the first diaphragm 13a, the second acoustic sensing unit 23b serves as a low-sensitive acoustic sensor for a sound pressure range from an intermediate volume to a large volume, and the first acoustic sensing unit 23a serves as a high-sensitive acoustic sensor for a sound pressure range from a small volume to an intermediate volume. Thus, the acoustic sensing units 23a and 23b are used as a hybrid sensing unit to cause a processing circuit (will be described later) to output a signal, so that the dynamic range of the acoustic sensor 11 can be widened. For example, the dynamic range of the first acoustic sensing unit 23a is set to be about 30 to 120 dB, and the dynamic range of the second acoustic sensing unit 23b is set to be about 50 to 140 dB. In this case, both the acoustic sensing units 23a and 23b are combined with each other to make it possible to widen the dynamic range to about 30 to 140 dB. When the acoustic sensor 11 is divided into the first acoustic sensing unit 23a for a range from a small volume to an intermediate volume and the second acoustic sensing unit 23b for a range from an intermediate volume to a large volume, an output from the first acoustic sensing unit 23a can be prevented from being used for a large volume, and the first acoustic sensing unit 23a may have a large total harmonic distortion in a high sound pressure range without a problem. Thus, the sensitivity of the first acoustic sensing unit 23a for a small volume can be increased.

Furthermore, in the acoustic sensor 11, the first acoustic sensing unit 23a and the second acoustic sensing unit 23b are formed on the same substrate. In addition, the first acoustic sensing unit 23a and the second acoustic sensing unit 23b are configured by the first diaphragm 13a and the second diaphragm 13b obtained by dividing the diaphragm 13 and the first fixed electrode plate 19a and the second fixed electrode plate 19b obtained by dividing the fixed electrode plate 19, respectively. More specifically, since a sensing unit that is originally one unit is divided by two to make the first acoustic sensing unit 23a and the second acoustic sensing unit 23b hybrid, in comparison with a conventional art in which two independent sensing units are formed on one substrate or a conventional art in which sensing units are formed on different substrates, respectively, fluctuations in detection sensitivity of the first acoustic sensing unit 23a and the second acoustic sensing unit 23b are similar to each other. As a result, the fluctuations in detection sensitivity between both the acoustic sensing units 23a and 23b can be reduced. Since both the acoustic sensing units 23a and 23b share the diaphragm and the fixed electrode plate, mismatching related to acoustic characteristics such as frequency characteristics and phases can be suppressed.

FIG. 7A is a plan view showing a partially cutaway microphone 41 in which the acoustic sensor 11 according to the first embodiment is built, and shows an inside of the microphone by removing the upper surface of a cover 43. FIG. 7B is a vertical sectional view of the microphone 41.

The microphone 41 is configured such that the acoustic sensor 11 and a signal processing circuit 44 (ASIC) are built in a package configured by a circuit board 42 and a cover 43. The acoustic sensor 11 and the signal processing circuit 44 are mounted on the upper surface of a circuit board 42. In the circuit board 42, a sound introduction hole 45 to guide acoustic vibration into the package is formed. The acoustic sensor 11 is mounted on the upper surface of the circuit board 42 to align the lower opening of the chamber 15 to the sound introduction hole 45 and to cover the sound introduction hole 45. Thus, the chamber 15 of the acoustic sensor 11 serves as a front chamber, and a space in the package serves as a back chamber.

The electrode pads 31, 32a, 32b, and 33 of the acoustic sensor 11 are connected to pads 47 of the signal processing circuit 44 with bonding wires 46, respectively. A plurality of terminals 48 to electrically connect the microphone 41 to the outside are formed on the lower surface of the circuit board 42, and electrode units 49 electrically connected to the terminals 48 are formed on the upper surface of the circuit board 42. The pads 50 of the signal processing circuit 44 mounted on the circuit board 42 are connected to the electrode units 49 with bonding wires 51, respectively. The pads 50 of the signal processing circuit 44 have a function of supplying a power source to the acoustic sensor 11 and a function of outputting a capacity change signal of the acoustic sensor 11 to the outside.

On the upper surface of the circuit board 42, the cover 43 is attached to cover the acoustic sensor 11 and the signal processing circuit 44. The package has an electromagnetic shielding function to protect the microphone 41 from electric disturbance or mechanical impact from the outside.

In this manner, acoustic vibration entering the package through the sound introduction hole 45 is detected by the acoustic sensor 11, amplified and signal-processed with the signal processing circuit 44, and then output. In the microphone 41, since the space in the package is used as a back chamber, the volume of the back chamber can be increased, and the sensitivity of the microphone 41 can be improved.

In the microphone 41, the sound introduction hole 45 to guide acoustic vibration into the package may be formed on the upper surface of the cover 43. In this case, the chamber 15 of the acoustic sensor 11 serves as a back chamber, and the space in the package serves as a front chamber.

Figure 7:
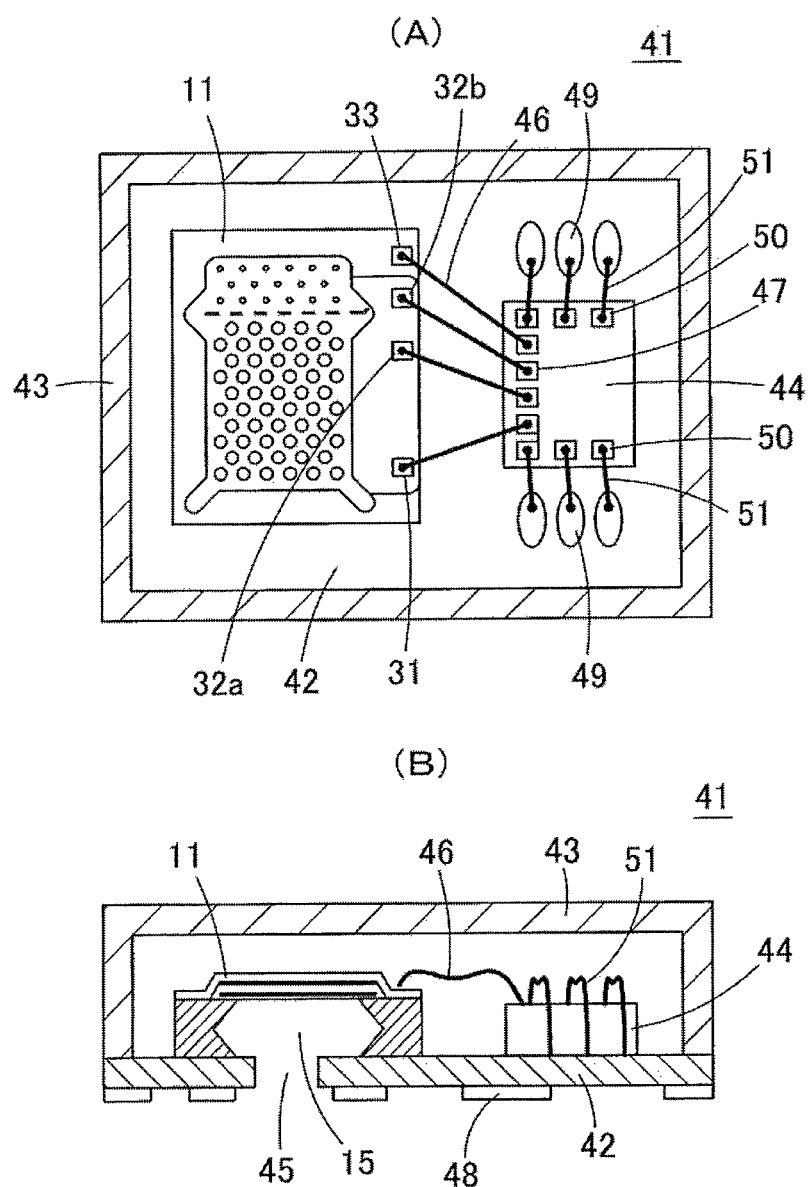
FIG. 7A is a plan view showing a partially cutaway microphone in which the acoustic sensor according to the first embodiment of the present invention and a signal processing circuit are stored in a casing.
FIG. 7B is a vertical sectional view of the microphone.
Figure 8:
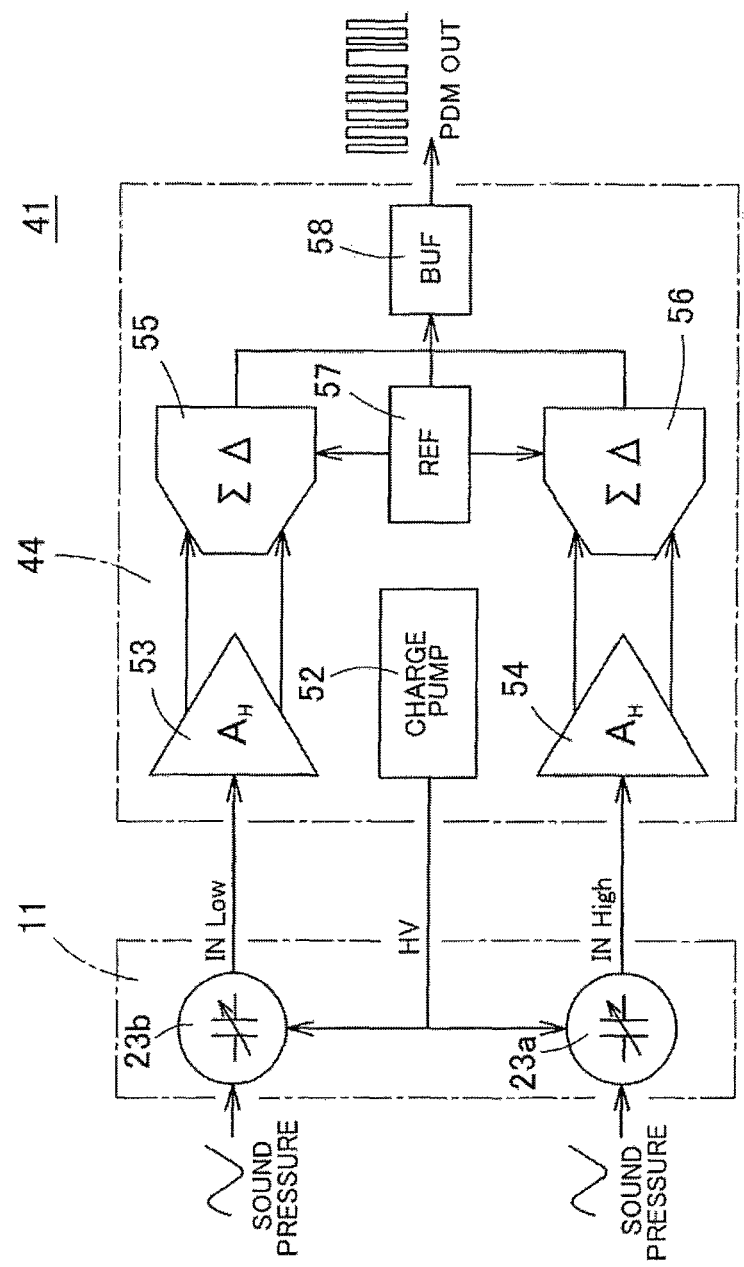
FIG. 8 is a circuit diagram of a microphone according to the first embodiment of the present invention.

FIG. 8 is a circuit diagram of the MEMS microphone 41 shown in FIG. 7. As shown in FIG. 8, the acoustic sensor 11 includes the high-sensitive first acoustic sensing unit 23a and the low-sensitive second acoustic sensing unit 23b the volumes of which change with acoustic vibration.

The signal processing circuit 44 includes a charge pump 52, an amplifier 53 for low sensitivity, an amplifier 54 for high sensitivity, $\Sigma\Delta(\Delta\Sigma)$-type ADCs (Analog-to-Digital Converters) 55 and 56, a reference voltage generator 57, and a buffer 58.

In the charge pump 52, a high voltage HV is applied to the first acoustic sensing unit 23a and the second acoustic sensing unit 23b, an electric signal output from the second acoustic sensing unit 23b is amplified with the amplifier 53 for low sensitivity, and an electric signal output from the first acoustic sensing unit 23a is amplified with the amplifier 54 for high sensitivity. The signal amplified with the amplifier 53 for low sensitivity is converted into a digital signal in the $\Sigma\Delta$-type ADC 55. Similarly, the signal amplified with the amplifier 54 for high sensitivity is converted into a digital signal in the $\Sigma\Delta$-type ADC 56. The digital signals converted in the $\Sigma\Delta$-type ADCs 55 and 56 are output as PDM (pulse density modulation) signals to the outside through the buffer 58. Although not shown, when the signal output from the buffer 58 has a high intensity (more specifically, a high sound pressure), an output from the $\Sigma\Delta$-type ADC 55 is kept on, and an output from the $\Sigma\Delta$-type ADC 56 is turned off. Thus, an electric signal of acoustic vibration having a high sound pressure detected with the second acoustic sensing unit 23b is output from the buffer 58. In contrast to this, when the signal output from the buffer 58 has a low intensity (more specifically, a low sound pressure), an output from the $\Sigma\Delta$-type ADC 56 is kept on, and an output from the $\Sigma\Delta$-type ADC 55 is turned off. Thus, an electric signal of acoustic vibration having a low sound pressure detected with the first acoustic sensing unit 23a is output from the buffer 58. In this manner, the first acoustic sensing unit 23a and the second acoustic sensing unit 23b are automatically switched depending on sound pressures.

In the example in FIG. 8, the two digital signals converted with the $\Sigma\Delta$-type ADCs 55 and 56 are mixed with each other to output the mixed signal on one data line. However, the two digital signals may be output onto different data lines, respectively.

Incidentally, in an acoustic sensor in which acoustic sensing units for high sensitivity and low sensitivity are arranged or a microphone in which the acoustic sensor is built, a diaphragm may be damaged by wind pressure acting when the microphone is dropped. According to the acoustic sensor 11 according to the first embodiment of the present invention, such damage can be prevented. The reason will be described below.

Figure 9:
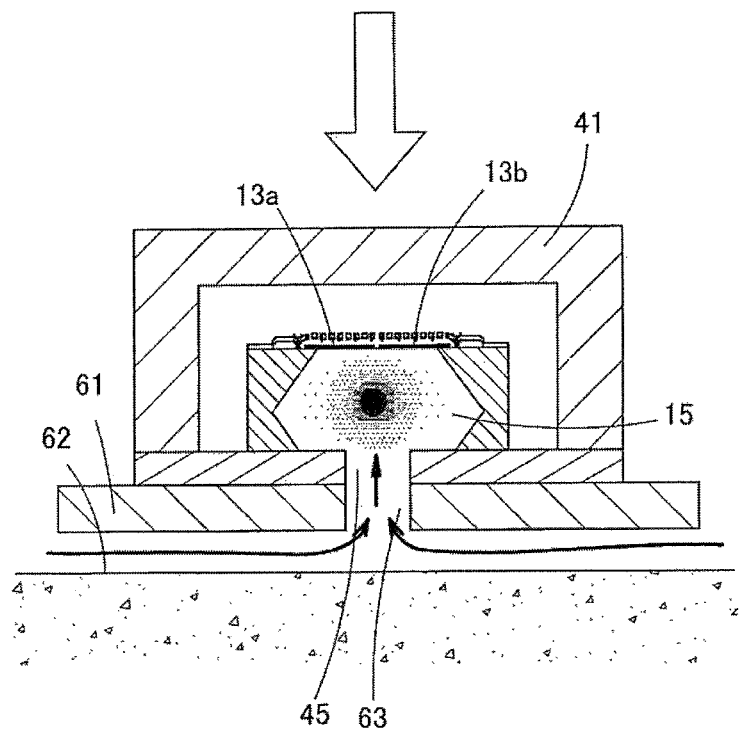
FIG. 9 is a schematic sectional view showing a manner of dropping a microphone.

FIG. 9 shows a manner of the microphone 41 when the microphone 41 mounted on a device 61 is dropped toward a ground surface 62. In the device 61, a through hole 63 is formed to correspond to the sound introduction hole 45 of the microphone 41. When the microphone 41 mounted on the device 61 as described above is dropped in a direction indicated by a void arrow, as indicated by a heavy-line arrow in FIG. 9, air blows from the through hole 63 and the sound introduction hole 45 into the chamber 15. For this reason, the air in the chamber 15 is compressed to increase a pressure in the chamber 15, and the diaphragms 13a and 13b are pushed upward. The diaphragms 13a and 13b are pushed upward also by a wind pressure or impulsive force of the air blown into the chamber 15.

Figure 10:
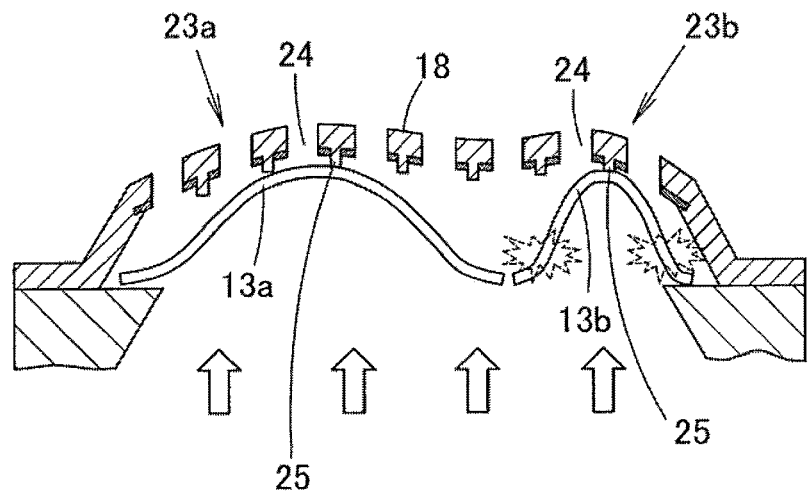
FIG. 10 a schematic sectional view showing a manner of damaging a microphone according to a comparative example by dropping.

FIG. 10 shows an acoustic sensor in a comparative example in which the diaphragm is pushed upward as described above. In the acoustic sensor according to the comparative example, unlike in the acoustic sensor 11 according to the first embodiment, uniform acoustic holes 24 are formed. More specifically, the acoustic holes 24 of the first acoustic sensing unit 23a and the acoustic holes 24 of the second acoustic sensing unit 23b are arranged at the same distribution density, and the hole diameters (opening areas) of the acoustic holes 24 are equal to each other. Since the second diaphragm 13b has an area smaller than that of the first diaphragm 13a, when a low pressure acts, an average displacement amount of the second diaphragm 13b is smaller than an average displacement amount of the first acoustic sensing unit 23a. However, when a pressure acting on the diaphragms 13a and 13b is high, since the first diaphragm 13a and the second diaphragm 13b that are largely displaced are brought into contact with the stoppers 25 of the back plate 18, the displacement amounts are almost equal to each other. Thus, since the second diaphragm 13b has a small area, deformation of the second diaphragm 13b is larger than that of the first diaphragm 13a. In particular, the peripheral portion of the second diaphragm 13b is largely distorted to generate large internal stress. In addition, since the same acoustic holes 24 as that of the first acoustic sensing unit 23a are also formed in the second acoustic sensing unit 23b, the rigidity of the back plate 18 in the second acoustic sensing unit 23b is relatively small like the rigidity of the back plate 18 of the first acoustic sensing unit 23a. For this reason, when the deformed second diaphragm 13b is brought into contact with back plate 18, the back plate 18 of the second acoustic sensing unit 23b is also bent, and the average displacement amount of the second diaphragm 13b increases more and more. As a result, in the acoustic sensor of the comparative example, as shown in FIG. 10, the second diaphragm 13b is largely deformed to make it easy to damage the peripheral portion.

In order to decrease the deformation of the second diaphragm 13b to make it difficult to damage the second diaphragm 13b, according to one or more embodiments of the present invention, the rigidity of the back plate 18 is improved to make it difficult to deform the back plate 18 even though the diaphragms 13a and 13b are brought into contact with the back plate 18. For this reason, according to one or more embodiments of present invention, the hole diameters of the acoustic holes 24 formed in the back plate 18 are reduced. However, in the comparative example, since the acoustic holes 24 having equal hole diameters are formed in the entire area of the back plate 18, when the hole diameters of the acoustic holes 24 are decreased, air molecules that cause thermal noise in the first acoustic sensing unit 23a are not easily escaped. For this reason, noise caused by thermal noise increases in the first acoustic sensing unit 23a, and the sensitivity of the first acoustic sensing unit 23a is deteriorated.

In order to improve the rigidity of the back plate 18, a method of increasing the thickness of the back plate 18 is conceived. However, even though the thickness of the back plate 18 increases, air molecules that cause thermal noise in the first acoustic sensing unit 23a are not easily escaped. For this reason, noise caused by thermal noise increases in the first acoustic sensing unit 23a, and the sensitivity of the first acoustic sensing unit 23a is deteriorated.

Figure 11:
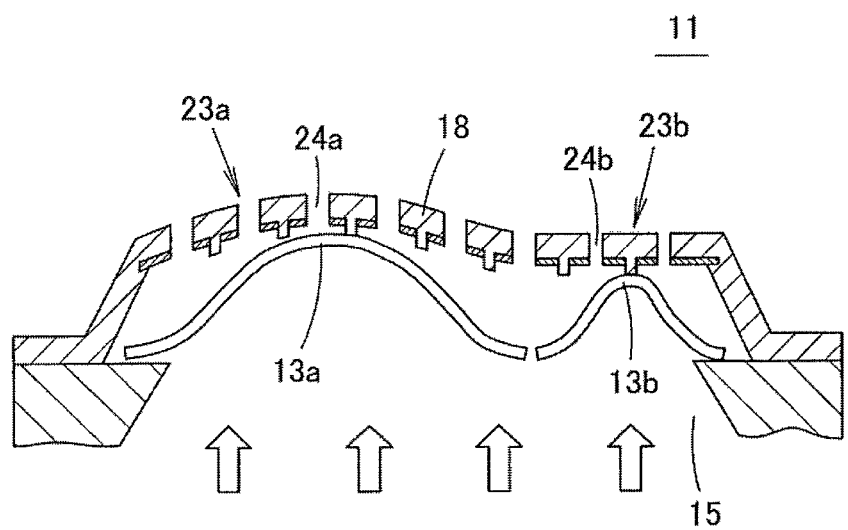
FIG. 11 is a schematic sectional view showing a manner of dropping the microphone according to the first embodiment of the present invention.

In contrast to this, in the acoustic sensor 11 according to the first embodiment, the hole diameters of the acoustic holes 24b in the second acoustic sensing unit 23b are smaller than the hole diameters of the acoustic holes 24a in the first acoustic sensing unit 23a. As a result, the rigidity of the back plate 18 in the second acoustic sensing unit 23b can be improved. Thus, as shown in FIG. 11, even though the second diaphragm 13b is deformed by dropping impact, wind pressure, air compressed in the chamber 15, and the like to be brought into contact with the back plate 18, the back plate 18 of the second acoustic sensing unit 23b is difficult to be deformed. For this reason, the back plate 18 can suppress excessive deformation and internal stress of the second diaphragm 13b to make it possible to prevent the second diaphragm 13b from being damaged.

On the other hand, in the first acoustic sensing unit 23a, the hole diameters of the acoustic holes 24a are set to general sizes, and the thickness of the back plate 18 are set to a general thickness. In this case, thermal noise in the first acoustic sensing unit 23a does not increase. For this reason, on the first acoustic sensing unit 23a side on which an S/N ratio is exactly requested, sensibility in a small volume range does not decrease. Since the second acoustic sensing unit 23b is used in a large volume range in which an output sufficiently higher than a noise level can be obtained, a request for an S/N ratio is not exact, and the hole diameters of the acoustic holes 24b may be reduced. Thus, according to the acoustic sensor 11 of the first embodiment, the second diaphragm 13b can be prevented from being damaged without decreasing the sensitivity on a small-volume side.

The hole diameters of the acoustic holes 24b in the acoustic sensor 11 are desirably ½ or less the hole diameters of the acoustic holes 24a. In particular, the hole diameters of the acoustic holes 24b are desirably 4 µm or more and 10 µm or less.

Figure 12:
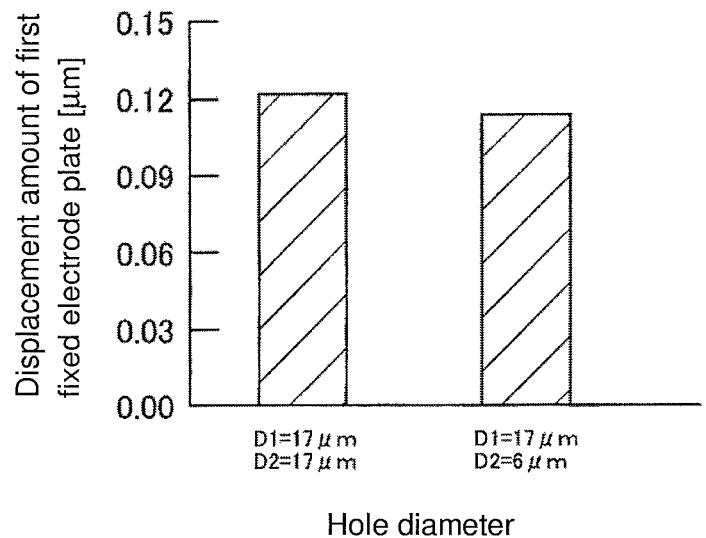
FIG. 12A is a diagram showing a displacement amount of a first fixed electrode plate when the hole diameters of acoustic holes in first and second acoustic sensing units are changed.
FIG. 12B is a diagram showing a displacement amount of a second fixed electrode plate when the hole diameters of acoustic holes in the first and second acoustic sensing units are changed.
Figure 12:
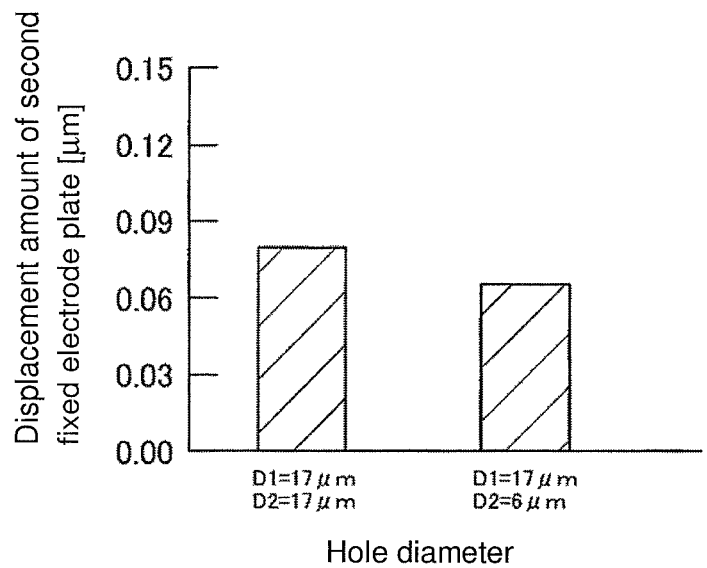

FIG. 12A shows a result obtained by simulating a displacement amount of the first fixed electrode plate 19a when a predetermined air pressure (air pressure supposed to act in dropping) is applied to the back plate 18 and the fixed electrode plate 19 to deform the back plate 18 and the fixed electrode plate 19. FIG. 12B shows a displacement amount of the second fixed electrode plate 19b at this time. FIG. 12A and FIG. 12B show a case in which D1=17 µm and D2=17 µm (comparative example) and a case in which D1=17 µm and D2=6 µm (first embodiment), respectively, where the hole diameter of the acoustic hole 24a and the hole diameter of the acoustic hole 24b are given by D1 and D2, respectively.

Referring to FIG. 12B, when the hole diameter D2 of the acoustic hole 24b is reduced from 17 µm to 6 µm, the displacement amount of the second fixed electrode plate 19b is reduced by 18% to make it possible to improve the rigidity. In this manner, the second diaphragm 13b can be suppressed from being deformed by an air pressure in dropping, and the second diaphragm 13b can be prevented from being damaged.

Referring to FIG. 12A, it can be understood that the hole diameter D2 of the acoustic hole 24b is reduced to make it possible to reduce the displacement of the first fixed electrode plate 19a.

Figure 13:
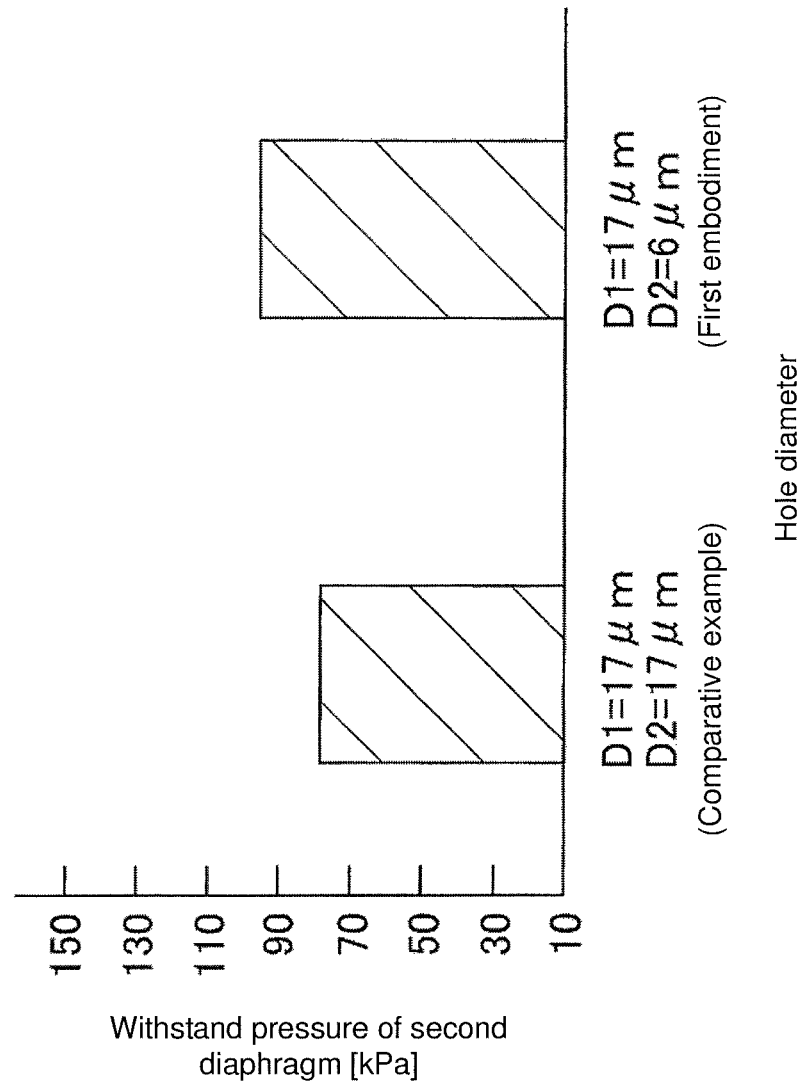
FIG. 13 is a diagram showing an air pressure (withstand pressure) at which a second diaphragm is damaged when a high air pressure acts on the diaphragm such that a comparative example and the first embodiment are compared with each other.

FIG. 13 shows a pressure value obtained when, in an acoustic sensor in the comparative example in which both the hole diameters D1 and D2 are 17 μm, pressures are applied to the diaphragms 13a and 13b while being gradually increased, and a pressure is further applied to the diaphragm 13b to bring the diaphragm 13b into contact with the stoppers 25 so as to break the second diaphragm 13b. FIG. 13 shows a pressure value obtained when, in the acoustic sensor 11 according to the first embodiment in which the hole diameters D1 and D2 are 17 μm and 6 μm, respectively, pressures are applied to the diaphragms 13a and 13b while being gradually increased, and a pressure is further applied to the diaphragm 13b to bring the diaphragm 13b into contact with the stoppers 25 so as to break the second diaphragm 13b. Referring to FIG. 13, when the hole diameters of the acoustic holes 24b are equal to the hole diameters of the acoustic holes 24a, the second diaphragm 13b is broken at 78 kPa. When the hole diameters of the acoustic holes 24b are reduced to 6 μm, a breaking strength of the second diaphragm 13b increases to about 95 kPa (22% improvement).

Figure 14:
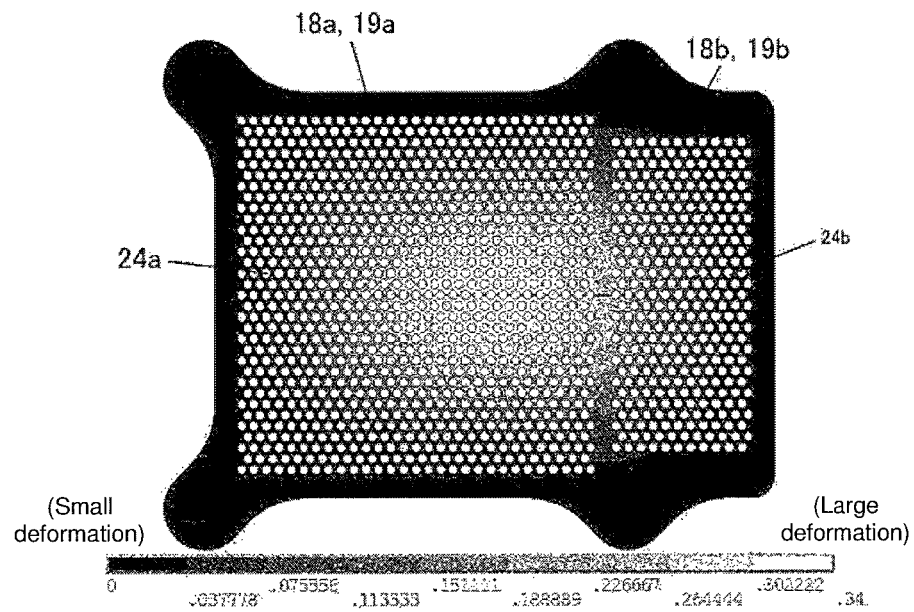
FIG. 14 is a diagram showing a distribution of displacement amounts of a back plate and a fixed electrode plate in an acoustic sensor according to the comparative example.

FIG. 14 is a diagram of a comparative example showing the back plate 18 and the fixed electrode plate 19 having the acoustic holes 24a and 24b the hole diameters D1 and D2 of which are 17 μm. This drawing shows deformation amounts of parts obtained when the back plate 18 and the fixed electrode plate 19 are deformed with a predetermined pressure depending on densities of black and white colors. The whiter the color is, the larger the deformation amount is, and the blacker the color is, the smaller the deformation amount is.

Figure 15:
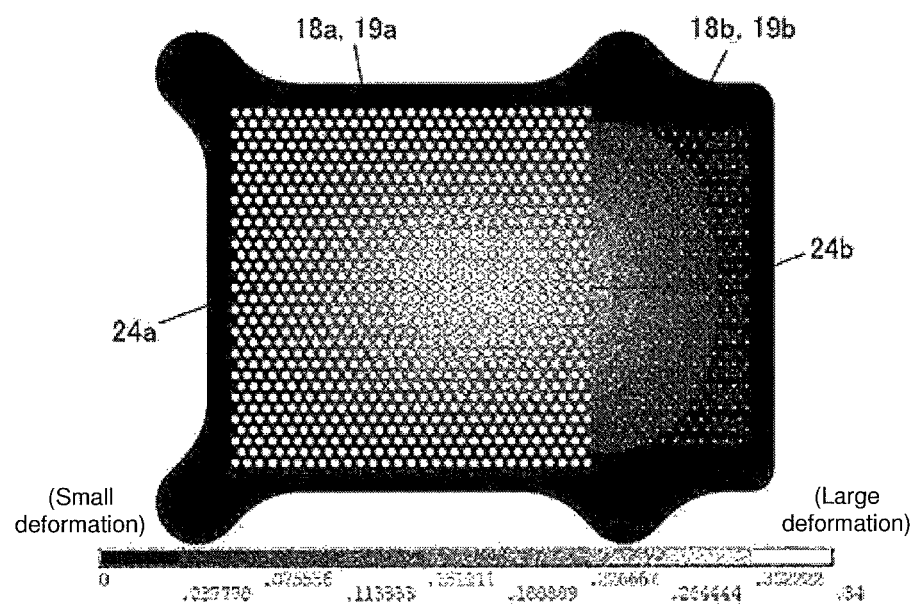
FIG. 15 is a diagram showing a distribution of displacement amounts of the back plate and the fixed electrode plate in the acoustic sensor according to the first embodiment of the present invention.

FIG. 15 is a diagram of the first embodiment showing the back plate 18 and the fixed electrode plate 19 having the acoustic holes 24a the hole diameters D1 of which are 17 μm and the acoustic holes 24b the hole diameters D2 of which are 6 μm. This drawing also shows deformation amounts of parts of the back plate 18 and the fixed electrode plate 19 under the same conditions as those in FIG. 14 depending on densities of black and white colors.

It is also apparent from the simulations in FIG. 14 and FIG. 15 that the hole diameters of the acoustic holes 24b are reduced to make it possible to reduce the displacement amounts of the second fixed electrode plate 19b (and the first fixed electrode plate 19a) and to improve the rigidity. In this manner, the second diaphragm 13b can be suppressed from being deformed by an air pressure in dropping, and the second diaphragm 13b can be prevented from being damaged.

In the acoustic sensor 11 and the microphone 41 according to the first embodiment, the diaphragm can be prevented from being damaged in dropping, and various effects are achieved.

The acoustic sensor 11 according to the first embodiment has an advantage of easy introduction. More specifically, (i) since the hole diameters of the acoustic holes 24b on the second acoustic sensing unit 23b side need only be changed, the characteristics (sensitivity, S/N ratio, and the like) of the first acoustic sensing unit 23a are not influenced. (ii) Since the film thickness of the back plate 18 need not be increased, a deposition time for the back plate 18 does not become long, and acoustic sensors can be produced with good productivity. A mask to form openings in the acoustic holes 24a and 24b need only be changed in design, and can be easily changed in design. (iii) An acoustic sensor can be introduced by only changing a mask design. (iv) When the alignment pitches of the acoustic holes 24a and 24b are constant, a change of a time required to etch a sacrifice layer is also small. As a result, conventional productive equipment can be used, and the number of manufacturing processes does not increase. For this reason, easy introduction can be achieved.

According to the acoustic sensor 11 of the first embodiment, (i) since an electrode area of the second fixed electrode plate 19b increases, output sensitivity of the second acoustic sensing unit 23b is improved, and (ii) since, due to a decrease in hole diameter of the acoustic holes 24b and the fringe effect, a capacitance equal to that obtained when a holeless fixed electrode plate is used can be achieved, the output sensitivity of the acoustic sensor 11 can be improved.

According to the acoustic sensor 11 of the first embodiment, the hole diameters of the acoustic holes 24b in the second acoustic sensing unit 23b are reduced to make it difficult to cause dust or dirt to enter the inside through the acoustic holes 24b. As a result, the risk that dust or dirt adheres to a diaphragm to change the characteristics of the acoustic sensor 11 becomes small.

According to the acoustic sensor 11 of the first embodiment, since the rigidity of the back plate 18 becomes high, warpage of the back plate 18 caused by a fluctuation in residual stress generated by the manufacturing processes of the acoustic sensor 11 reduces, and the shape of the back plate 18 becomes stable.

According to the acoustic sensor 11 of the first embodiment, since the rigidity of the back plate 18 becomes high, the strength of the back plate 18 against impact in a drop test or the like is improved.

When the first diaphragm 13a collides with the back plate 18 in a large-volume state, vibration with large distortion occurs in the back plate 18 in the first acoustic sensing unit 23a. The first acoustic sensing unit 23a interferes with the second acoustic sensing unit 23b through the back plate 18, and the vibration with large distortion is transmitted to the second acoustic sensing unit 23b side. In this case, a total harmonic distortion in the second acoustic sensing unit 23b increases, and the characteristics of the second acoustic sensing unit 23b may be deteriorated. However, according to the acoustic sensor 11 of the first embodiment, since the rigidity of the back plate 18 becomes high, the vibration with large distortion generated in the first acoustic sensing unit 23a is not easily transmitted to the second acoustic sensing unit 23b. As a result, the total harmonic distortion in the second acoustic sensing unit 23b is improved.

Modification of First Embodiment

Figure 16:
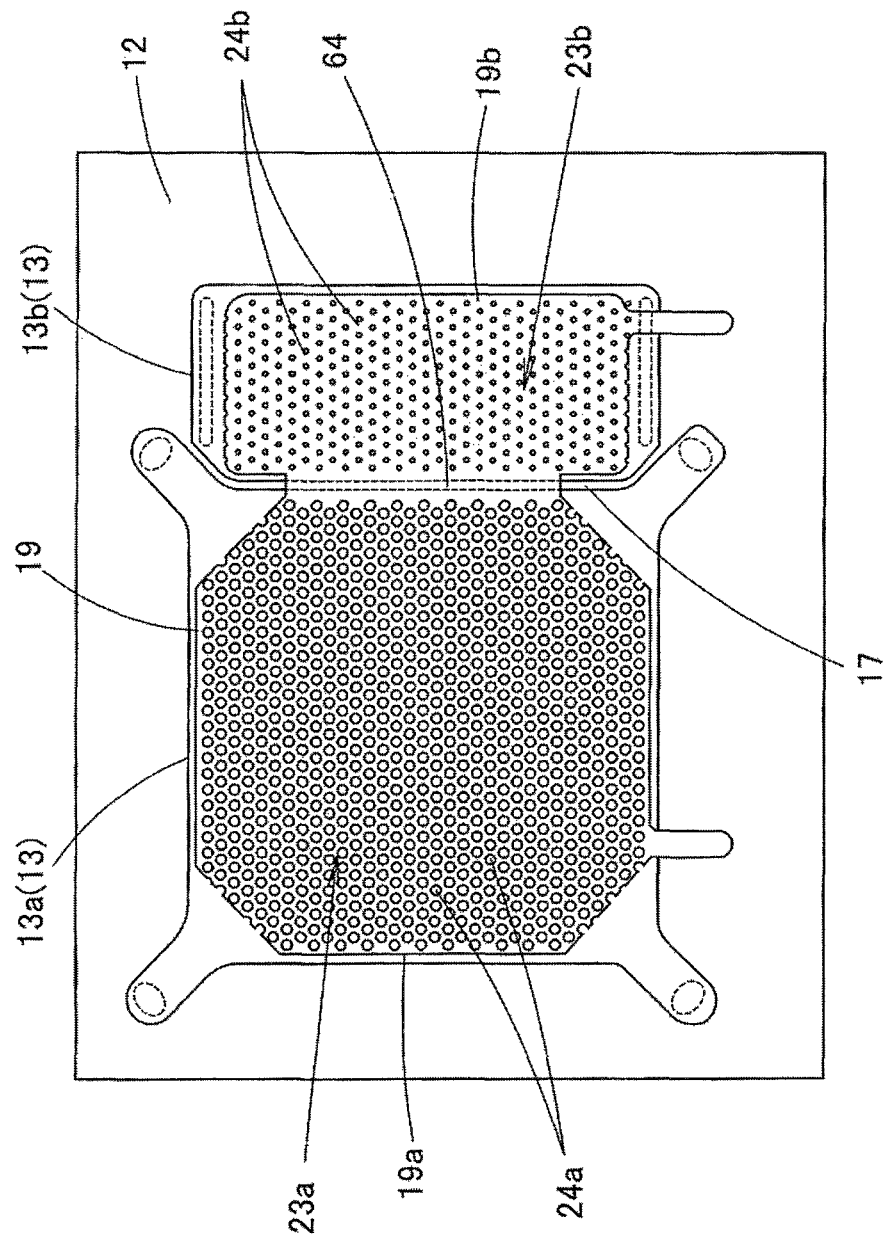
FIG. 16 is a plan view of a modification of the first embodiment of the present invention.

FIG. 16 is a plan view showing an acoustic sensor according to a modification of the first embodiment of the present invention, and shows a state in which the back plate 18, the protecting film 30, and the like are removed. As in the acoustic sensor, the diaphragm 13 is completely separated by the slit 17 into the first diaphragm 13a and the second diaphragm 13b, and the first fixed electrode plate 19a and the second fixed electrode plate 19b are integrally connected to each other with a connection unit 64.

Second Embodiment

Figure 17:
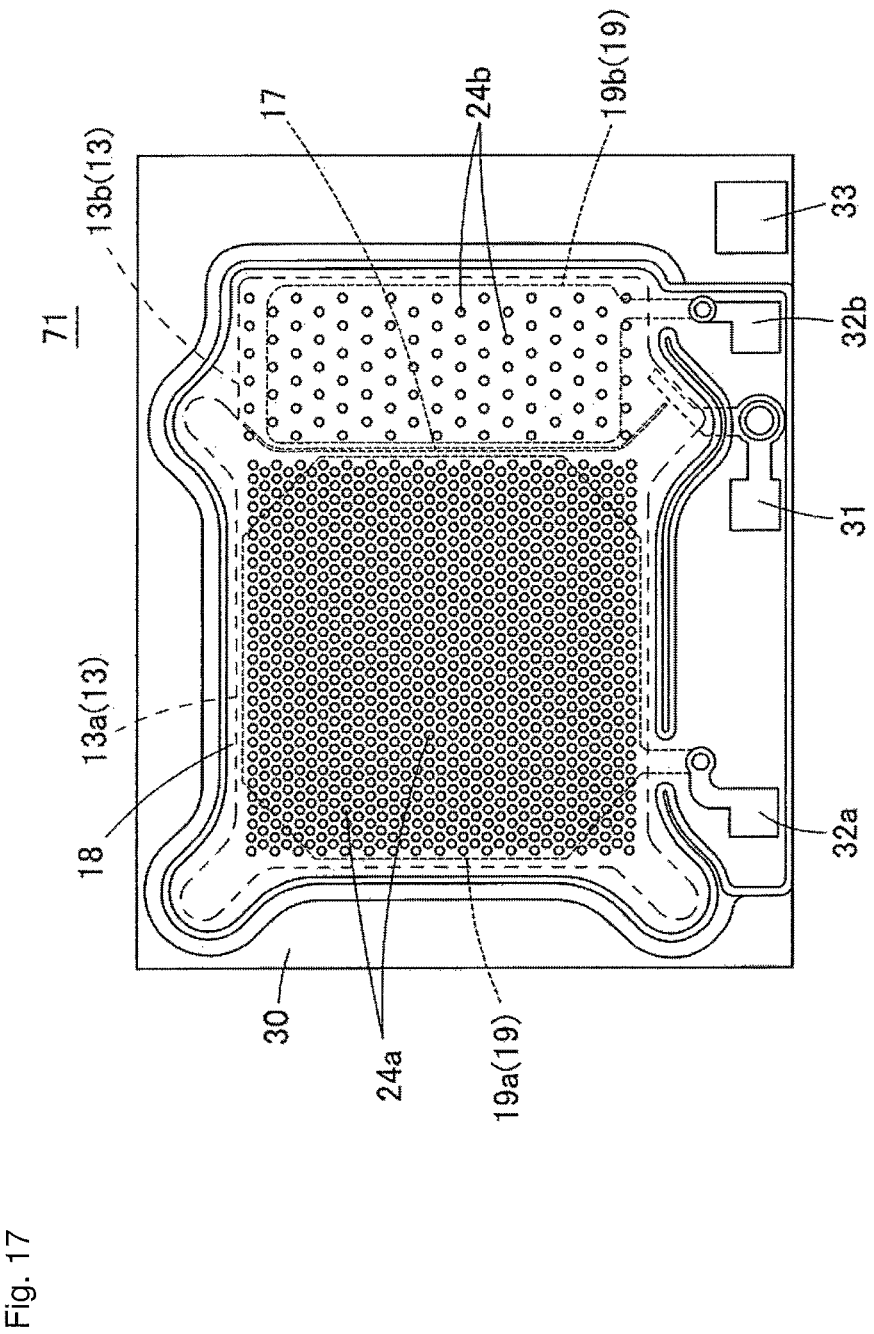
FIG. 17 is a plan view of an acoustic sensor according to a second embodiment of the present invention.

FIG. 17 is a plan view of an acoustic sensor 71 according to a second embodiment of the present invention. In the acoustic sensor 71, the acoustic holes 24b of the second acoustic sensing unit 23b have a distribution density (number density) lower than that of the acoustic holes 24a of the first acoustic sensing unit 23a. More specifically, an alignment pitch of the acoustic holes 24b is larger than an alignment pitch of the acoustic holes 24a. According to one or more embodiments of the present invention, the alignment pitch of the acoustic holes 24b is twice or more the alignment pitch of the acoustic holes 24a. On the other hand, the hole diameters of the acoustic holes 24a of the first acoustic sensing unit 23a are equal to the hole diameters of the acoustic holes 24b of the second acoustic sensing unit 23b. With respect to points other than the above points, the acoustic sensor 71 has the same structure as that of the acoustic sensor 11 according to the first embodiment, and a description thereof will be omitted.

In the acoustic sensor 71, since the distribution density of the acoustic holes 24b is lower than the distribution density of the acoustic holes 24a, an aperture ratio of the acoustic holes 24b is small, and the rigidity of the back plate 18 in the second acoustic sensing unit 23b is high. As a result, the back plate 18 is not easily deformed even though the second diaphragm 13b collides with the back plate 18, and a displacement amount and a deformation amount of the second diaphragm 13b are suppressed. As a result, large stress is not easily generated in the second diaphragm 13b, and the second diaphragm 13b can be prevented from being damaged. Since the number of acoustic holes 24b decreases, dust or dirt does not easily enter the acoustic sensor 71 through the acoustic holes 24b.

In the acoustic sensor 71, although the hole diameters of the acoustic holes 24a are equal to the hole diameters of the acoustic holes 24b, the distribution density of the acoustic holes 24b may be made smaller than that of the acoustic holes 24a, and the hole diameters of the acoustic holes 24b may be smaller than those of the acoustic holes 24a.

Furthermore, when an aperture ratio of the acoustic holes 24b as a whole is smaller than an aperture ratio of the acoustic holes 24a, the hole diameters of the acoustic holes 24b are smaller than the hole diameters of the acoustic holes 24a, and the distribution density of the acoustic holes 24b may be larger than the distribution density of the acoustic holes 24a. In contrast to this, when an aperture ratio of the acoustic holes 24b as a whole is smaller than an aperture ratio of the acoustic holes 24a, the distribution density of the acoustic holes 24b is lower than the distribution density of the acoustic holes 24a, and the hole diameters of the acoustic holes 24b may be larger than the hole diameters of the acoustic holes 24a.

Third Embodiment

Figure 18:
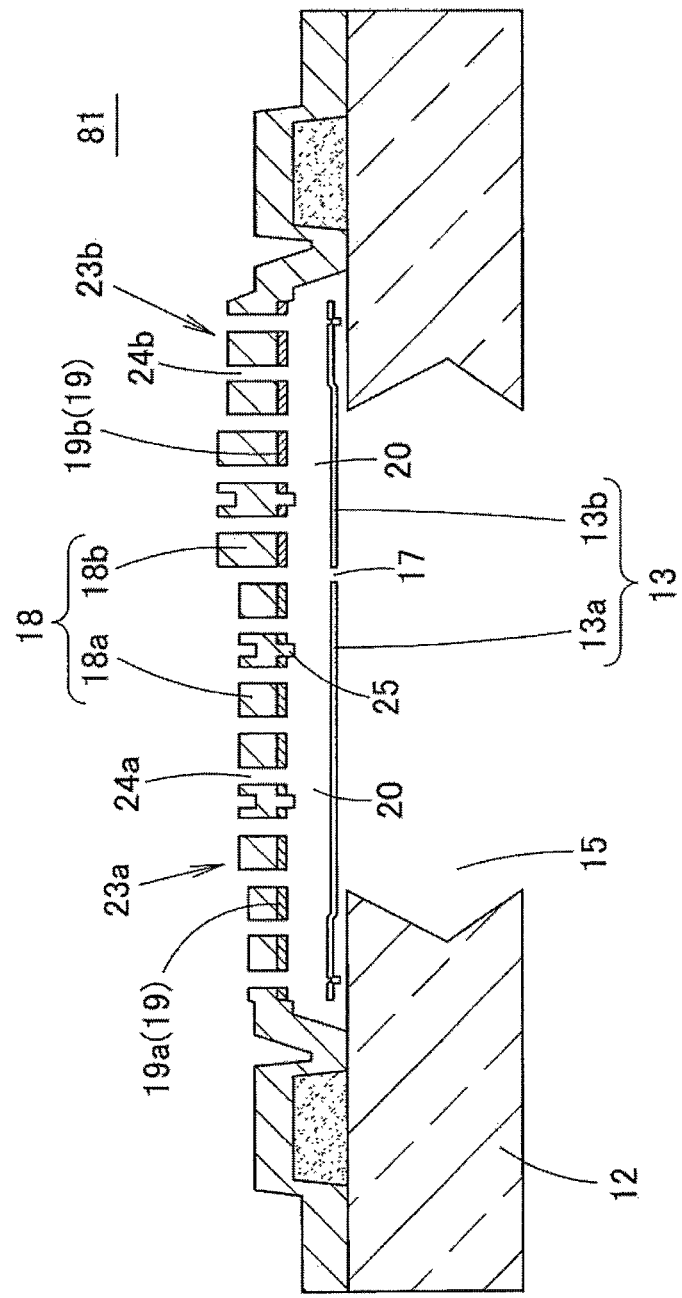
FIG. 18 is a sectional view of the acoustic sensor according to a third embodiment of the present invention.

FIG. 18 is a sectional view of an acoustic sensor 81 according to a third embodiment of the present invention. In the acoustic sensor 81, the thickness of the back plate 18, i.e., a back plate 18b, in the second acoustic sensing unit 23b is larger than the thickness of the back plate 18, i.e., a back plate 18a, in the first acoustic sensing unit 23a. The distribution densities and the hole diameters of the acoustic holes 24a may be equal to the distribution densities and the hole diameters of the acoustic holes 24b. With respect to points other than the above points, the acoustic sensor 71 has the same structure as that of the acoustic sensor 11 according to the first embodiment, and a description thereof will be omitted.

In the acoustic sensor 81, since the thickness of the back plate 18b is larger than the thickness of the back plate 18a, the rigidity of the back plate 18b in the second acoustic sensing unit 23b is high. As a result, even though the second diaphragm 13b collides with the back plate 18b, the back plate 18b is not easily deformed, and a displacement amount or a deformation amount of the second diaphragm 13b are suppressed. As a result, large stress is not easily generated in the second diaphragm 13b, and the second diaphragm 13b can be prevented from being damaged.

Fourth Embodiment

Figure 19:
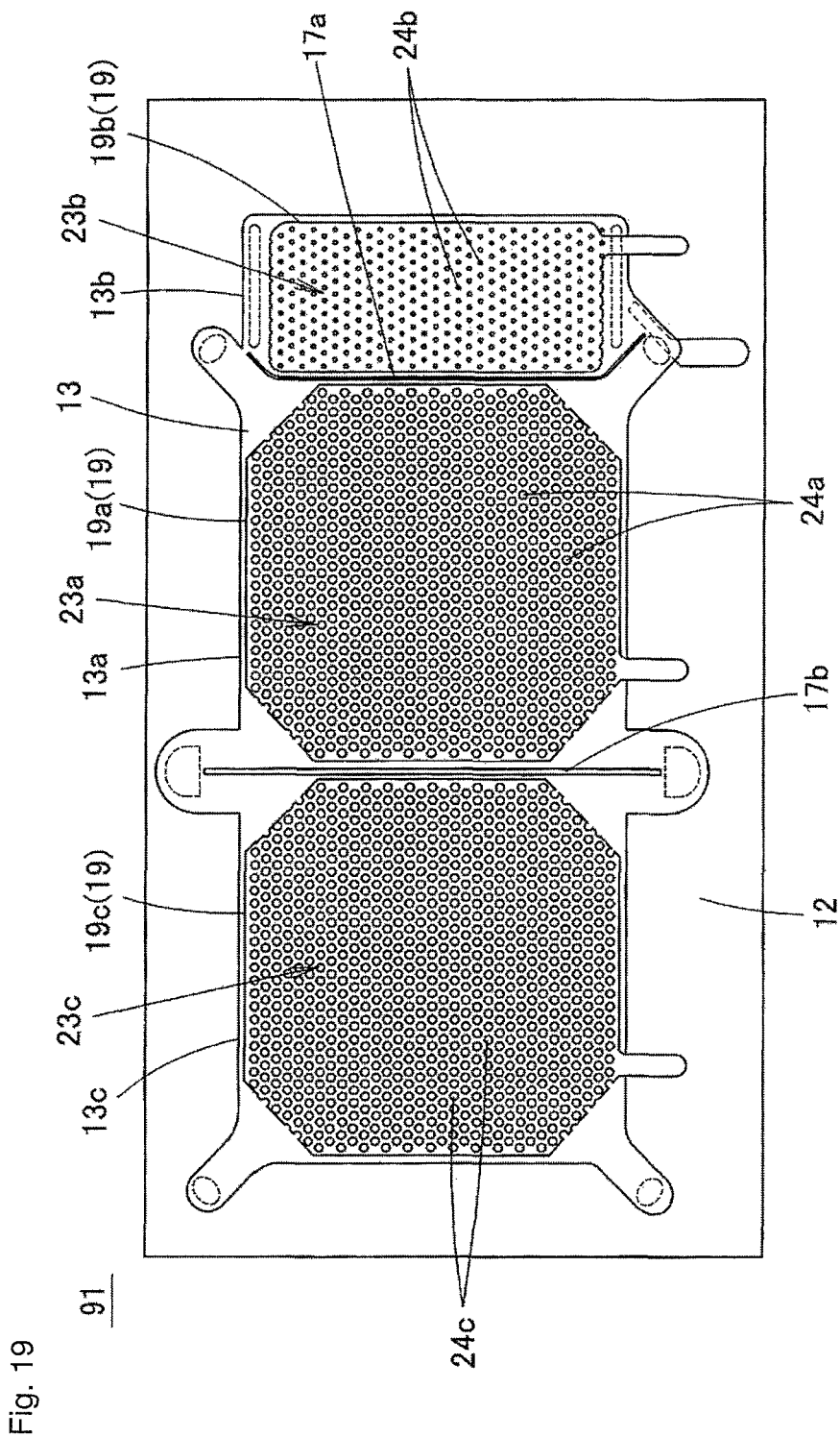
FIG. 19 is a plan view showing a structure of an acoustic sensor according to a fourth embodiment of the present invention, and shows a state in which a back plate, a protecting film, and the like are removed.

FIG. 19 is a plan view showing a structure of an acoustic sensor 91 according to a fourth embodiment of the present invention, and shows a state in which a back plate, a protecting film, and the like are removed. The acoustic sensor 91 has three acoustic sensing units 23a, 23b, and 23c. The acoustic sensing unit 23a has a capacitor structure configured by a diaphragm 13a and a fixed electrode plate 19a. The acoustic sensing unit 23c has a capacitor structure configured by a diaphragm 13c and a fixed electrode plate 19c. The acoustic sensing units 23a and 23c are high-sensitive sensing units for a low sound pressure range. The acoustic sensing unit 23b has a capacitor structure configured by a diaphragm 13b and a fixed electrode plate 19b, and is a low-sensitive sensing unit for a high sound pressure range.

In the acoustic sensor 91, the diaphragm 13 having a nearly rectangular shape is arranged above the chamber 15 of the silicon substrate 12. The diaphragm 13 is divided by two slits 17a and 17b into the first diaphragm 13a and the third diaphragm 13c that have almost equal areas and nearly rectangular shapes and the second diaphragm 13b that has a nearly rectangular shape having an area smaller than those of the first and third diaphragms 13a and 13c. A part, i.e., the first fixed electrode plate 19a of the fixed electrode plate 19 is arranged to face the first diaphragm 13a. Similarly, a part, i.e., the second fixed electrode plate 19b of the fixed electrode plate 19 is arranged to face the second diaphragm 13b. A part, i.e., the third fixed electrode plate 19c of the fixed electrode plate 19 is arranged to face the third diaphragm 13c. The fixed electrode plates 19a, 19b, and 19c are separated from each other and arranged on the lower surface of the back plate 18 fixed to the upper surface of the silicon substrate 12 to cover the diaphragm 13.

In the high-sensitive acoustic sensing units 23a and 23c for a low sound pressure, a large number of acoustic holes 24a and 24c are formed in the back plate 18 and the fixed electrode plates 19a and 19c. In the low-sensitive acoustic sensing unit 23b for a high sound pressure, the large number of acoustic holes 24b are formed in the back plate 18 and the fixed electrode plate 19b. The acoustic holes 24b of the acoustic sensing unit 23b have aperture ratios smaller than those of the acoustic holes 24a and 24c of the acoustic sensing units 23a and 23c (in FIG. 19, although the hole diameters of the acoustic holes 24b are smaller than the hole diameters of the acoustic holes 24a and 24c, the pitch of the acoustic holes 24b may be larger than those of the acoustic holes 24a and 24c), and the rigidity of the back plate 18 in the acoustic sensing unit 23b is higher than that in the acoustic sensing units 23a and 23c. Thus, the impact resistance of the low-sensitive acoustic sensing unit 23b is high.

As in the acoustic sensor 91, when three (or three or more) acoustic sensing units are arranged, three (or three or more) detection signals can be output from one sensor.

Fifth Embodiment

Figure 20:
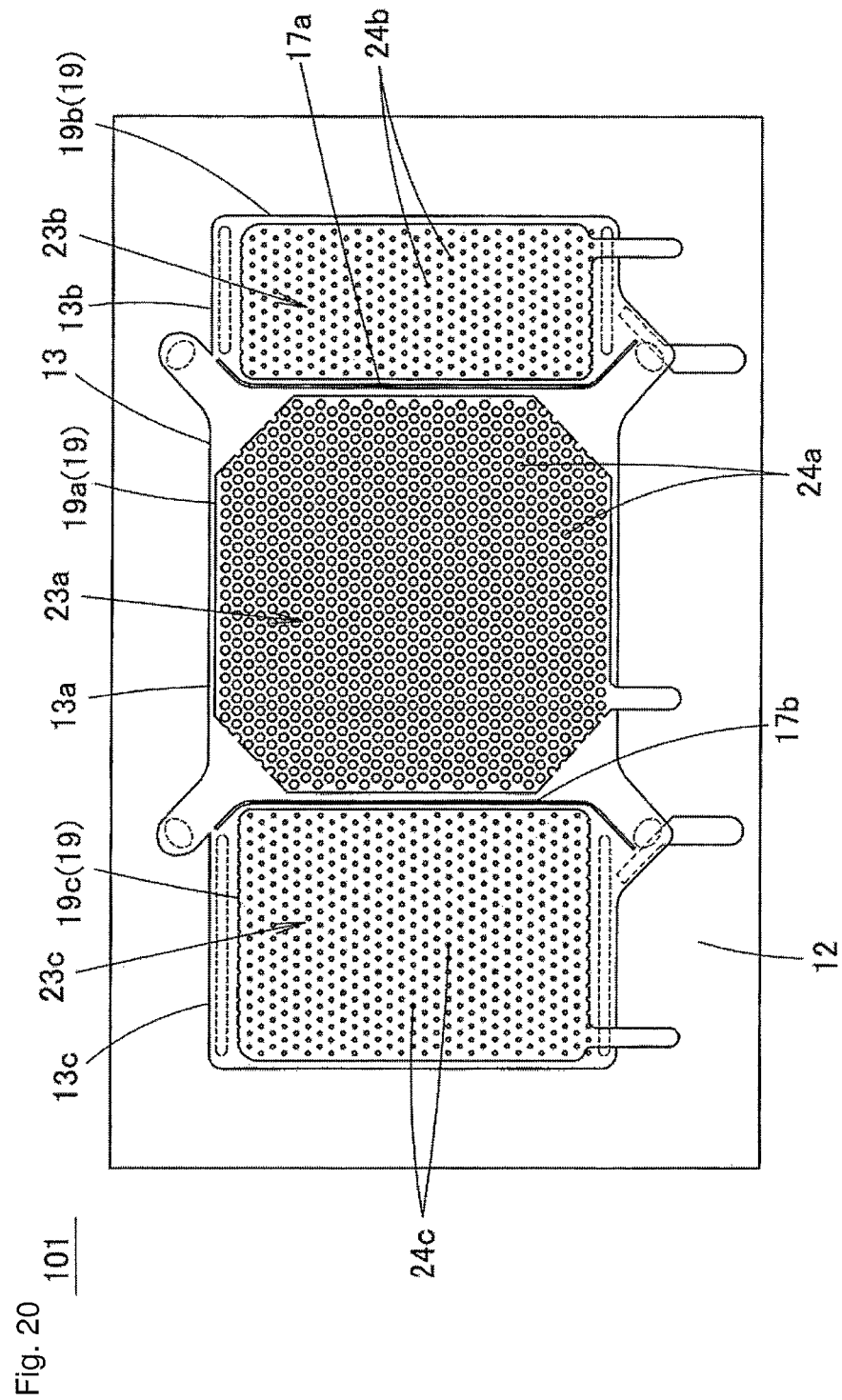
FIG. 20 is a plan view showing a structure of an acoustic sensor according to a fifth embodiment of the present invention, and shows a state in which a back plate, a protecting film, and the like are removed.

FIG. 20 is a plan view showing a structure of an acoustic sensor 101 according to a fifth embodiment of the present invention, and shows a state in which a back plate, a protecting film, and the like are removed. The acoustic sensor 101 also has the three acoustic sensing units 23a, 23b, and 23c. The acoustic sensing unit 23a has a capacitor structure configured by the diaphragm 13a and the fixed electrode plate 19a, and is a high-sensitive sensing unit for a low sound pressure range. The acoustic sensing unit 23b has a capacitor structure configured by a diaphragm 13b and a fixed electrode plate 19b, and is a low-sensitive sensing unit for a high sound pressure range. The acoustic sensing unit 23c has a capacitor structure configured by the diaphragm 13c and the fixed electrode plate 19c, and is an intermediate-sensitive sensing unit for an intermediate sound pressure range.

In the acoustic sensor 101, the diaphragm 13 having a nearly rectangular shape is arranged above the chamber 15 of the silicon substrate 12. The diaphragm 13 is divided by the two slits 17a and 17b into the first diaphragm 13a having a nearly rectangular shape, the third diaphragm 13c having a nearly rectangular shape having an area smaller than that of the first diaphragm 13a, and the second diaphragm 13b having a nearly rectangular shape having an area smaller than that of the third diaphragm 13c. The first fixed electrode plate 19a is arranged to face the first diaphragm 13a. Similarly, the second fixed electrode plate 19b is arranged to face the second diaphragm 13b. The third fixed electrode plate 19c faces the third diaphragm 13c. The fixed electrode plates 19a, 19b, and 19c are separated from each other and arranged on the lower surface of the back plate 18 fixed to the upper surface of the silicon substrate 12 to cover the diaphragm 13.

In the high-sensitive acoustic sensing units 23a for a low sound pressure, the large number of acoustic holes 24a are formed in the back plate 18 and the fixed electrode plate 19a. In the low-sensitive acoustic sensing unit 23b for a high sound pressure and the intermediate-sensitive acoustic sensing unit 23c for an intermediate sound pressure, the large number of acoustic holes 24b and 24c are formed in the back plate 18 and the fixed electrode plates 19b and 19c, respectively. The acoustic holes 24b and 24c of the acoustic sensing units 23b and 23c have aperture ratios smaller than those of the acoustic holes 24a of the acoustic sensing unit 23a (in FIG. 20, although the hole diameters of the acoustic holes 24b and 24c are smaller than the hole diameters of the acoustic holes 24a, the pitch of the acoustic holes 24b and 24c may be larger than those of the acoustic holes 24a), and the rigidity of the back plate 18 in the acoustic sensing units 23b and 23c is higher than that in the acoustic sensing units 23a. Thus, the impact resistances of the low-sensitive acoustic sensing unit 23b and the intermediate-sensitive acoustic sensing unit 23c are high. The aperture ratio of the acoustic holes 24c can also be smaller than the aperture ratio of the acoustic holes 24a and larger than the aperture ratio of the acoustic holes 24b.

According to the acoustic sensor 101 having the above structure, the dynamic range thereof can be more widened, and, therefore, the impact resistance of the acoustic sensor 101 is not easily deteriorated.

Other

Figure 1:
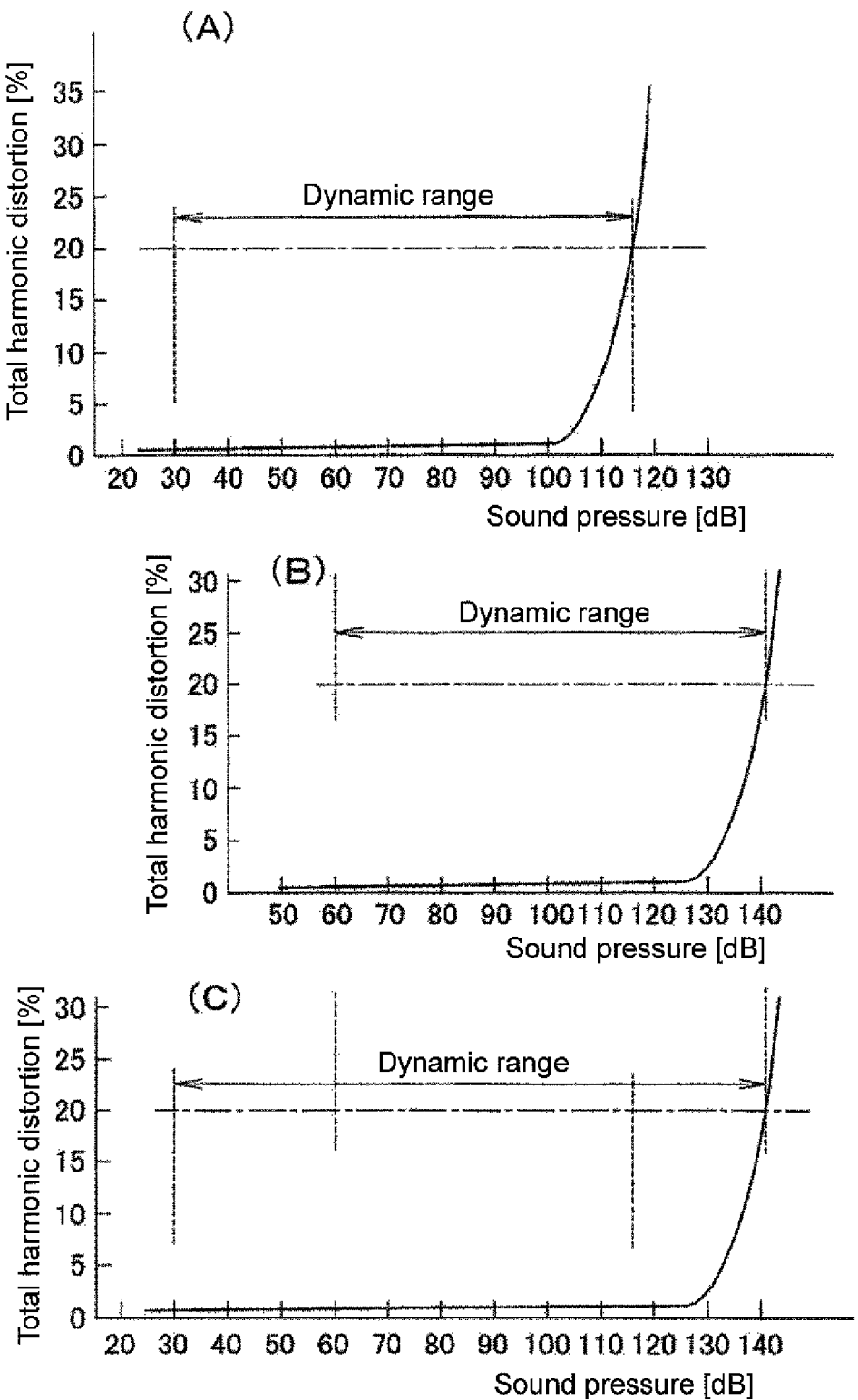
FIG. 1A is a diagram showing a relationship between a total harmonic distortion and a sound pressure in a high-sensitive acoustic sensor in Patent Document 1.
FIG. 1B is a diagram showing a relationship between a total harmonic distortion and a sound pressure in a low-sensitive acoustic sensor in Patent Document 1.
FIG. 1C is a diagram showing a relationship between a total harmonic distortion and a sound pressure when the high-sensitive acoustic sensor and the low-sensitive acoustic sensor in Patent Document 1 are combined with each other.
Figure 2:
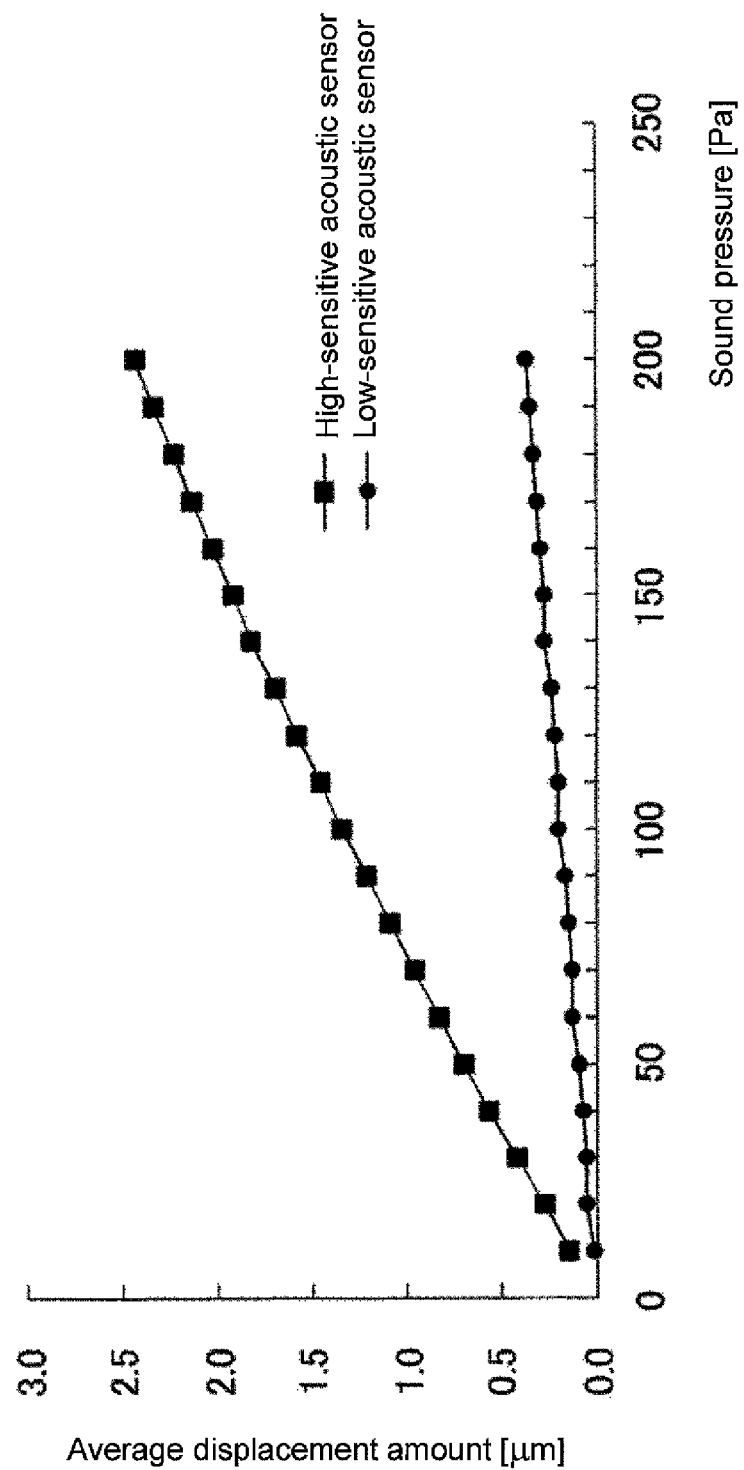
FIG. 2 is a diagram showing relationships between average displacement amounts and sound pressures of diaphragms in the high-sensitive acoustic sensor and the low-sensitive acoustic sensor in Patent Document 1.

A mode of dividing the diaphragm 13 or the fixed electrode plate 19 is not limited to the modes as described in the above embodiments. For example, the fixed electrode plate 19 may be divided into an outer peripheral region and an inner region, a small-area region located in the outer peripheral region and having a nearly annular shape may be used as the low-sensitive second fixed electrode plate 19b, and a region inside the second fixed electrode plate 19b may be used as the high-sensitive first fixed electrode plate 19a (see FIG. 1 in Japanese Patent Application No. 2011-002313). This is also applied to the diaphragm 13.

In one or more of the above embodiments, the area of the first diaphragm 13a is made different from the area of the second diaphragm 13b to make the displacement amounts of the diaphragms 13a and 13b different from each other when equal sound pressures are applied to the diaphragms, thereby making the sensitivities of the first acoustic sensing unit 23a and the second acoustic sensing unit 23b different from each other. In addition, for example, the film thickness of the second diaphragm 13b may be made larger than the film thickness of the first diaphragm 13a to decrease displacement of the second diaphragm 13b and to reduce the sensitivity of the second acoustic sensing unit 23b in advance. In addition, the fixed pitch of the second diaphragms 13b may be made smaller than the fixed pitch of the first diaphragms 13a to decrease displacement of the second diaphragm 13b and to reduce and the sensitivity of the second acoustic sensing unit 23b. Furthermore, the first diaphragm 13a may be supported with a beam structure to increase displacement of the first diaphragm 13a and to improve the sensitivity of the first acoustic sensing unit 23a.

Although an acoustic sensor and a microphone using the acoustic sensor have been described above, one or more embodiments of the present invention can also be applied to a capacitance sensor except for an acoustic sensor such as a pressure sensor.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 11, 71, 81, 91, 101 acoustic sensor
12 silicon substrate
13 diaphragm
13a first diaphragm
13b second diaphragm
13c third diaphragm
17, 17a, 17c slit
18, 18a, 18b back plate
19 fixed electrode plate
19a first fixed electrode plate
19b second fixed electrode plate
19c third fixed electrode plate
23a, 23b, 23c acoustic sensing unit
24, 24a, 24b acoustic hole
25 stopper
41 microphone
42 circuit board
43 cover
44 signal processing circuit
45 sound introduction hole

The invention claimed is:
1. A capacitance sensor comprising:
a substrate;
a vibration electrode plate formed over an upper side of the substrate;
a back plate formed over the upper side of the substrate to cover the vibration electrode plate; and
a fixed electrode plate arranged on the back plate facing the vibration electrode plate,
wherein at least one of the vibration electrode plate and the fixed electrode plate is divided into a plurality of regions,
wherein a sensing unit configured by the vibration electrode plate and the fixed electrode plate is formed in each of the divided regions, wherein the plurality of sensing units output a plurality of signals having different sensitivities, wherein at least some sensing units of the sensing units have vibration electrode plates having areas different from the areas of the vibration electrode plates in the other sensing units, wherein, of the sensing units, some sensing units having the vibration electrode plates having small areas have back plates in the regions of the corresponding sensing units having rigidity higher than rigidity of the back plates in the other sensing units having the vibration electrode plates having large areas, wherein a plurality of openings to cause acoustic vibration to pass are formed in the back plate and the fixed electrode plate, and wherein the sensing unit outputs a signal by a change in capacitance between the diaphragm and the fixed electrode plate that respond to the acoustic vibration.

2. A capacitance sensor comprising:

a substrate;

a vibration electrode plate formed over an upper side of the substrate;

a back plate formed over the upper side of the substrate to cover the vibration electrode plate; and a fixed electrode plate arranged on the back plate facing the vibration electrode plate, wherein at least one of the vibration electrode plate and the fixed electrode plate is divided into a plurality of regions, wherein a sensing unit configured by the vibration electrode plate and the fixed electrode plate is formed in each of the divided regions, wherein the plurality of sensing units output a plurality of signals having different sensitivities, wherein each of the sensing units has a plurality of openings in the back plate and the fixed electrode plate, wherein at least some sensing units of the sensing units have vibration electrode plates having areas different from the areas of the vibration electrode plates in the other sensing units, and wherein, of the sensing units, at least one pair of sensing units having the vibration electrode plates having different areas are configured such that an aperture ratio of the opening in the sensing unit having the vibration electrode plate having a small area is smaller than an aperture ratio of the opening in the sensing unit having the vibration electrode plate having a large area.

3. The capacitance sensor according to claim 2, wherein the aperture ratio of the back plate is adjusted by a hole diameter of the opening.

4. The capacitance sensor according to claim 3, wherein at least one of the vibration electrode plate and the fixed electrode plate is divided into two regions in which the two sensing units are formed, and wherein the hole diameter of the opening in the sensing unit having the vibration electrode plate having a small area is half or less of the hole diameter of the opening in the sensing unit having the vibration electrode plate having a large area.

5. The capacitance sensor according to claim 4, wherein a hole diameter of the opening in the sensing unit having the vibration electrode plate having a small area is 10 µm or less.

6. The capacitance sensor according to claim 2, wherein the aperture ratio of the back plate is adjusted by a distribution density of the openings.

7. The capacitance sensor according to claim 6, wherein at least one of the vibration electrode plate and the fixed electrode plate is divided into two regions in which the two sensing units are formed, and wherein an alignment pitch of the openings in the sensing unit having the vibration electrode plate having a small area is twice or more an alignment pitch of the openings in the sensing unit having the vibration electrode plate having a large area.

8. The capacitance sensor according to claim 2, wherein the aperture ratio of the back plate is adjusted by hole diameters and a distribution density of the openings.

9. A capacitance sensor comprising:

a substrate;

a vibration electrode plate formed over an upper side of the substrate;

a back plate formed over the upper side of the substrate to cover the vibration electrode plate; and a fixed electrode plate arranged on the back plate facing the vibration electrode plate, wherein at least one of the vibration electrode plate and the fixed electrode plate is divided into a plurality of regions, wherein a sensing unit configured by the vibration electrode plate and the fixed electrode plate is formed in each of the divided regions, wherein the plurality of sensing units output a plurality of signals having different sensitivities, wherein at least some sensing units of the sensing units have vibration electrode plates having areas different from the areas of the vibration electrode plates in the other sensing units, and wherein, of the sensing units, at least one pair of sensing units having the vibration electrode plates having different areas are configured such that a thickness of the back plate in the sensing unit having the vibration electrode plate having a small area is larger than a thickness of the back plate in the sensing unit having the vibration electrode plate having a large area.

10. The capacitance sensor according to claim 1, wherein the vibration electrode plate is divided into a plurality of regions, and wherein a sensing unit configured by the vibration electrode plate and the fixed electrode plate is formed in each of the divided regions.

11. A microphone comprising the acoustic sensor according to claim 1, and a circuit unit that amplifies a signal from the acoustic sensor to output the amplified signal to the outside.

* * * * *